United States Patent [19]
Hiratsuka et al.

[11] Patent Number: 5,453,707
[45] Date of Patent: Sep. 26, 1995

[54] POLYPHASE CLOCK GENERATION CIRCUIT

[75] Inventors: Koichi Hiratsuka; Hiroshi Hikichi, both of Tokyo, Japan

[73] Assignee: NEC Corporation, Tokyo, Japan

[21] Appl. No.: 178,026

[22] Filed: Jan. 6, 1994

[30] Foreign Application Priority Data

Jan. 13, 1993 [JP] Japan ................................ 5-003712

[51] Int. Cl.⁶ ............................................... H03K 19/096
[52] U.S. Cl. .............................. 326/97; 326/28; 327/259; 377/121
[58] Field of Search ..................... 307/443, 452, 307/480–481, 269; 377/121; 326/28, 93, 97–98; 327/259

[56] References Cited

U.S. PATENT DOCUMENTS

| | | | |
|---|---|---|---|
| 4,394,586 | 7/1983 | Morozumi | 307/452 X |
| 4,816,700 | 3/1989 | Imel | 307/408 X |
| 4,877,974 | 10/1989 | Kawai et al. | 307/269 |
| 4,929,854 | 5/1990 | Iino et al. | 307/480 |
| 5,086,236 | 2/1992 | Feemster | 307/481 X |
| 5,111,076 | 5/1992 | Tarng | |

FOREIGN PATENT DOCUMENTS

| | | |
|---|---|---|
| 0254786A1 | 3/1988 | European Pat. Off. . |
| 0348894A2 | 3/1990 | European Pat. Off. . |
| 0463854A1 | 2/1992 | European Pat. Off. . |
| 3740362A1 | 9/1988 | Germany . |

OTHER PUBLICATIONS

European Search Report EP 94 10 0443, dated Oct. 11, 1994.

*Primary Examiner*—David R. Hudspeth
*Attorney, Agent, or Firm*—Whitham, Curtis, Whitham & McGinn

[57] ABSTRACT

A single-phase clock and an output signal of a second delay circuit are inputted to a first NAND gate and a first NOR gate. The output signal of the first NAND gate is inputted to a gate of a first PMOS transistor of a first clock driver. The output signal of the first NOR gate is inputted to a gate of a first NMOS transistor of the first clock driver. Meanwhile, an inverted clock outputted from an inverter and an output signal of a first delay circuit are inputted to a second NAND circuit and a second NOR circuit. The output signal of the second NAND gate is inputted to a gate of a second PMOS transistor of a second clock driver. The output signal of the second NOR gate is inputted to a gate of a second NMOS transistor of the second clock driver.

20 Claims, 12 Drawing Sheets

POLYPHASE CLOCK GENERATION CIRCUIT

BACKGROUND OF THE INVENTION

The present invention relates to a polyphase clock generation circuit which employs a clock driver of the Complementary Metal Oxide Semiconductor (CMOS) inverter configuration.

In recent years, there has been a progressively increasing demand for high-speed operation and low-power dissipation in semiconductor integrated circuits for use in microcomputers or like electronic apparatus in which desired processing is executed in response to polyphase clocks. However, the characteristics of actual semiconductor integrated circuits cannot satisfy this demand because the power dissipation of these circuits increases as the speed of operation increases. As a conventional example of polyphase clock generation circuit used to generate polyphase clocks in such semiconductor integrated circuits, a two-phase clock generation circuit which generates from a single-phase clock $\phi$ a first clock $\phi_1$ and a second clock $\phi_2$ of different phase is described below with reference to FIG. 1.

The two-phase clock generation circuit 100 includes an inverter 101, a first NAND gate 102, a second NAND gate 103, a first delay circuit 104, a second delay circuit 105, a first clock driver 106, and a second clock driver 107. The inverter 101 inverts the polarity of the single-phase clock $\phi$ to produce an inverted clock $\phi'$. The first NAND gate 102 negates the logical AND between the single-phase clock $\phi$ and the output signal of the second delay circuit 105. The second NAND gate 103 negates the logical AND between the inverted clock $\phi'$ and the output signal of the first delay circuit 104. The first delay circuit 104 delays the output signal of the first NAND gate 102 by a predetermined first delay time $dt_1$. The second delay circuit 105 delays the output signal of the second NAND gate 103 by a predetermined second delay time $dt_2$. The first clock driver 106 has the configuration of a CMOS inverter formed from a first PMOS transistor $M_{p1}$ and a first NMOS transistor $M_{n1}$, and inverts the polarity of the output signal of the first NAND gate 102 to produce the first clock $\phi_1$. The second driver 107 has the configuration of a CMOS inverter formed from a second PMOS transistor $M_{p2}$ and a second NMOS transistor $M_{n2}$, and inverts the polarity of the output signal of the second NAND gate 103 to produce the second clock $\phi_2$.

The operation of the two-phase clock generation circuit 100 is described with reference to a timing chart shown in FIG. 2. It is assumed that, as an initial state, sufficient time has passed while the single-phase clock $\phi$ remains at high level and the two-phase clock generation circuit 100 is in a stable condition. In this condition, the first clock $\phi_1$ is at high level while the second clock $\phi_2$ is at low level, as shown at time $t_0$ in FIG. 2. When the single-phase clock $\phi$ subsequently changes to low level at time $t_1$, the output signal of the first NAND gate 102 changes to high level, and consequently, the first clock $\phi_1$ changes from high level to low level after the delay of the delay time provided by the first clock driver 106. Meanwhile, at time $t_1$, the inverted clock $\phi'$ outputted from the inverter 101 changes to high level. However, since the output signal of the first NAND gate 102 is inputted to the second NAND gate 103 only after the delay of the delay time $dt_1$ of the first delay circuit 104, the output signal of the first NAND gate 102 changes from high level to low level after the delay of the first delay time $dt_1$ from time $t_1$. As the delay time at the second clock driver 107 is substantially equal to the delay time at the first clock driver 106, the second clock $\phi_2$ changes from low level to high level after the delay of the first delay time $dt_1$ that commences when the first clock $\phi_1$ changes from high level to low level. Thereafter, when the single-phase clock $\phi$ changes from low level to high level at time $t_2$, the inverted clock $\phi'$ outputted from the inverter 101 changes to low level. As a result, the output signal of the second NAND gate 103 changes to high level and the second clock $\phi_2$ changes from high level to low level after the delay of the delay time at the second clock driver 107. Meanwhile, at time $t_2$, the output signal of the second NAND gate 103 changes to high level. However, since the output signal of the second NAND gate 103 is inputted to the first NAND gate 102 after the delay of the second delay time $dt_2$ of the second delay circuit 105, the output signal of the first NAND gate 102 changes from high level to low level after the delay of the second delay time $dt_2$ from the time $t_2$. As the delay time at the first clock driver 106 is substantially equal to the delay time at the second clock driver 107, the first clock $\phi_1$ changes from low level to high level after the delay of the second delay time $dt_2$ that commences when the second clock $\phi_2$ changes from high level to low level. Thereafter, the operations described above take place repetitively. Accordingly, in the two-phase clock generation circuit 100, the first and second clocks $\phi_1$ and $\phi_2$ do not exhibit an overlapping condition of high level thereof and repeat their level variations in synchronism with the single-phase clock $\phi$.

In a semiconductor integrated circuit in which processing is executed in response to polyphase clocks, it is normally necessary that active periods (periods of high level or low level) of the clocks do not overlap with each other. This is because cases in which the active periods of the clocks overlap with each other can cause malfunction of the semiconductor integrated circuit such as a direct transmission phenomenon of data in a latch of the master-slave configuration. Accordingly, a polyphase clock generation circuit must generate clocks such that the magnitude of the displacement between the timing of a level variation of one clock and the timing of a level variation of another clock (that is, a delay between the clocks) may be greater than the magnitude of the gradient of the waveform of the rising or falling edge of the one clock. However, the magnitude of the gradient of the waveform of the rising or falling edge of the clock depends upon the power source voltage for driving the polyphase clock generation circuit (that is, an application of the polyphase clock generation circuit), the weight of the lead to the polyphase clock generation circuit, and various other parameters. For example, the gradient of the waveform of the rising or falling edge of the clock when the polyphase clock generation circuit is used with a system wherein the power source voltage is 3 V is higher than that when the polyphase clock generation circuit is used with another system wherein the power source voltage is 5 V, and accordingly, the delay between the clocks must be greater where the power source voltage is 3 V. However, although increasing the delay between clocks increases the margin of safety against malfunctions, increased delay also decreases the operation speed of the semiconductor integrated circuit which operates with the clocks. Accordingly, as the delay between clocks has an appropriate magnitude suitable for the application, a polyphase clock generation circuit is preferably constructed so as to allow adjustment of the delay between clocks from the outside in order to increase the applicability of the polyphase clock generation circuit to various applications.

Since the first clock driver 106 shown in FIG. 1 is constructed from the inverter of the CMOS configuration formed from the first PMOS transistor $M_{p1}$ and the first NMOS transistor $M_{n1}$, it has input/output characteristic such as the characteristics illustrated in FIG. 3. When the input voltage $V_{IN}$ to the first clock driver 106 (that is, the voltage of the output signal of the first NAND gate 102) is substantially equal to 0 V, the first PMOS transistor $M_{p1}$ is ON and the first NMOS transistor $M_{n1}$ is OFF, and consequently, the output voltage $V_{OUT}$ of the first clock driver 106 (that is, the voltage of the first clock $\phi_1$) is substantially equal to the power source voltage $V_{DD}$. On the other hand, when the input voltage $V_{IN}$ is substantially equal to the power source voltage $V_{DD}$, the first PMOS transistor $M_{p1}$ is OFF and the first NMOS transistor $M_{n1}$ is ON, and consequently, the output voltage $V_{OUT}$ is substantially equal to 0 V. Accordingly, within a period within which the first clock driver 106 is in a stable condition, such as a period "a" or another period "c" shown in FIG. 3, at least one of the first PMOS transistor $M_{p1}$ and the first NMOS transistor $M_{n1}$ is OFF, and no through-current flows through the first clock driver 106. As a result, the power dissipation of the first clock driver 106 in a stable condition is very low. However, within a period of a transition condition such as a period "b" shown in FIG. 3, the first PMOS transistor $M_{p1}$ and the first NMOS transistor $M_{n1}$ are both ON, and through-current flows through the first clock driver 106. The through-current increases as the channel widths (that is, the conductance) of the first PMOS transistor $M_{p1}$ and the first NMOS transistor $M_{n1}$ increase and as the operation frequency (that is, the frequency of the single-phase clock $\phi$) increases.

Accordingly, conventional polyphase clock generation circuits which include clock drivers of the CMOS inverter configuration such as the two-phase clock generation circuit 100 shown in FIG. 1 have problems in that the power dissipation is high since through-current flows upon switching of the clock drivers, that the power dissipation by the clock drivers increases as the operation frequency increases, and that power source noise or ground noise is produced.

SUMMARY OF THE INVENTION

An object of the present invention is to provide a polyphase clock generation circuit which can achieve reduction of the power dissipation and prevention of production of power source noise and ground noise by suppressing production of through-current upon switching of clock drivers of the CMOS inverter configuration using a delay between clocks.

Other objects of the present invention will become obvious from the following description.

In accordance with an aspect of the present invention, there is provided a polyphase clock generation circuit which comprises: a first power source voltage terminal; a second power source voltage terminal; a clock driver including a P-channel field-effect transistor with a source connected to the first power source voltage terminal, and an N-channel field-effect transistor with a source connected to the second power source voltage terminal and a drain connected to a drain of the P-channel field-effect transistor; and clock driver driving means for turning on the P-channel field-effect transistor and the N-channel field-effect transistor alternately and independently of each other so that the P-channel field-effect transistor and N-channel field-effect transistor may not have an ON-state simultaneously with each other.

BRIEF DESCRIPTION OF THE DRAWINGS

The features and advantages of the present invention will become apparent from the following description when taken in conjunction with the accompanying drawings in which.

DESCRIPTION OF THE PREFERRED EMBODIMENTS

Figure 1:
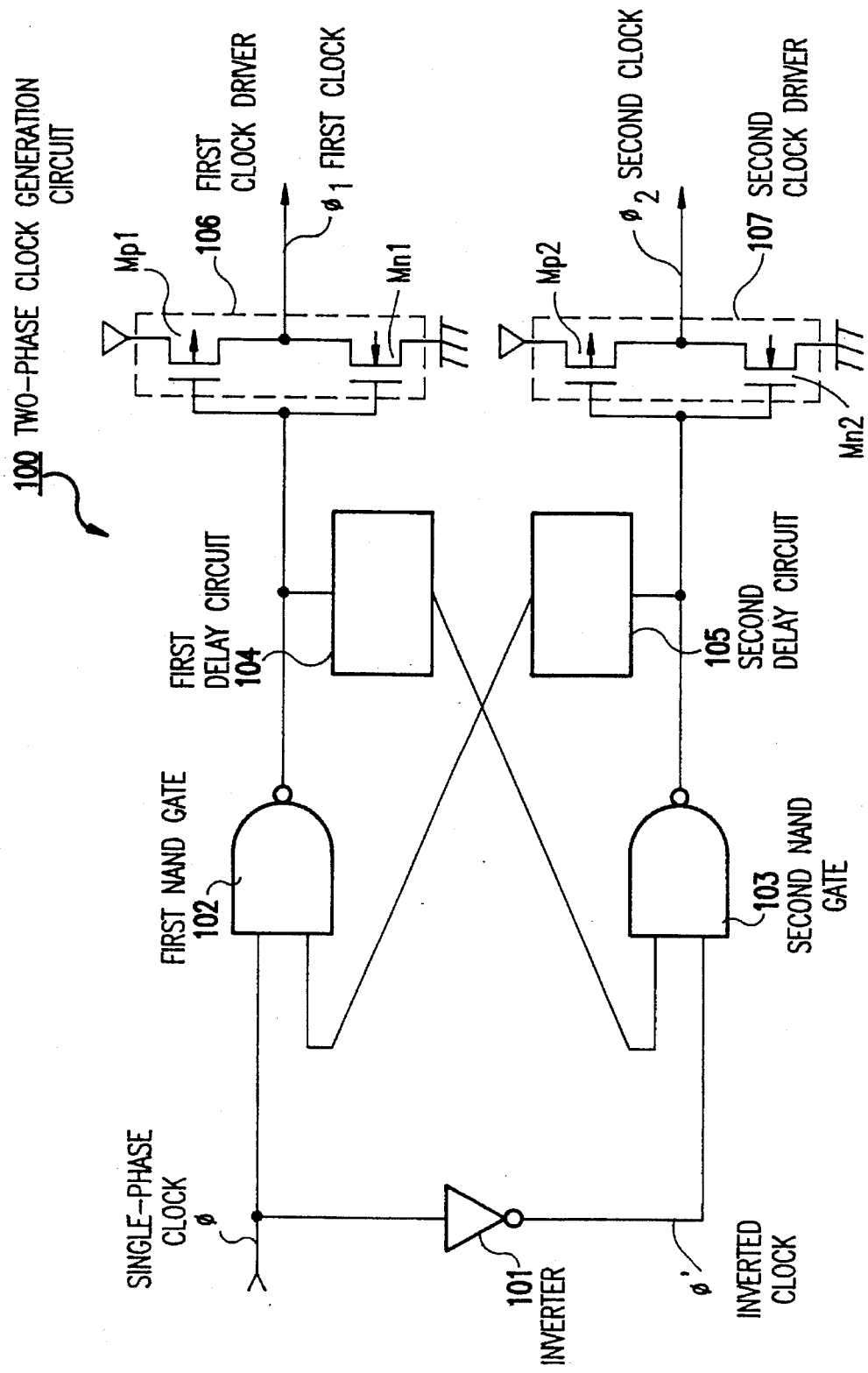
FIG. 1 is a circuit diagram showing a two-phase clock generation circuit which is a conventional example of a polyphase clock generation circuit.
Figure 2:
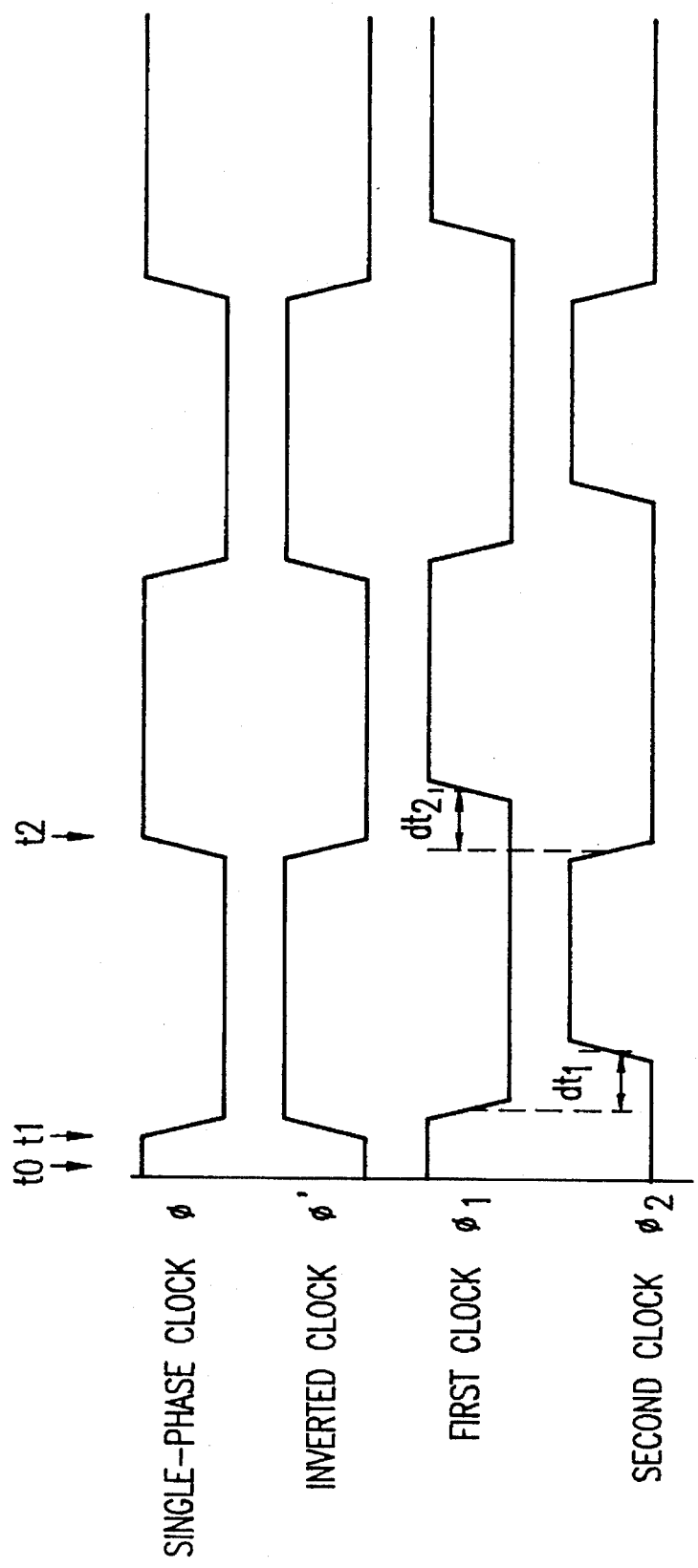
FIG. 2 is a timing chart illustrating operation of the two-phase clock generation circuit shown in FIG. 1.
Figure 3:
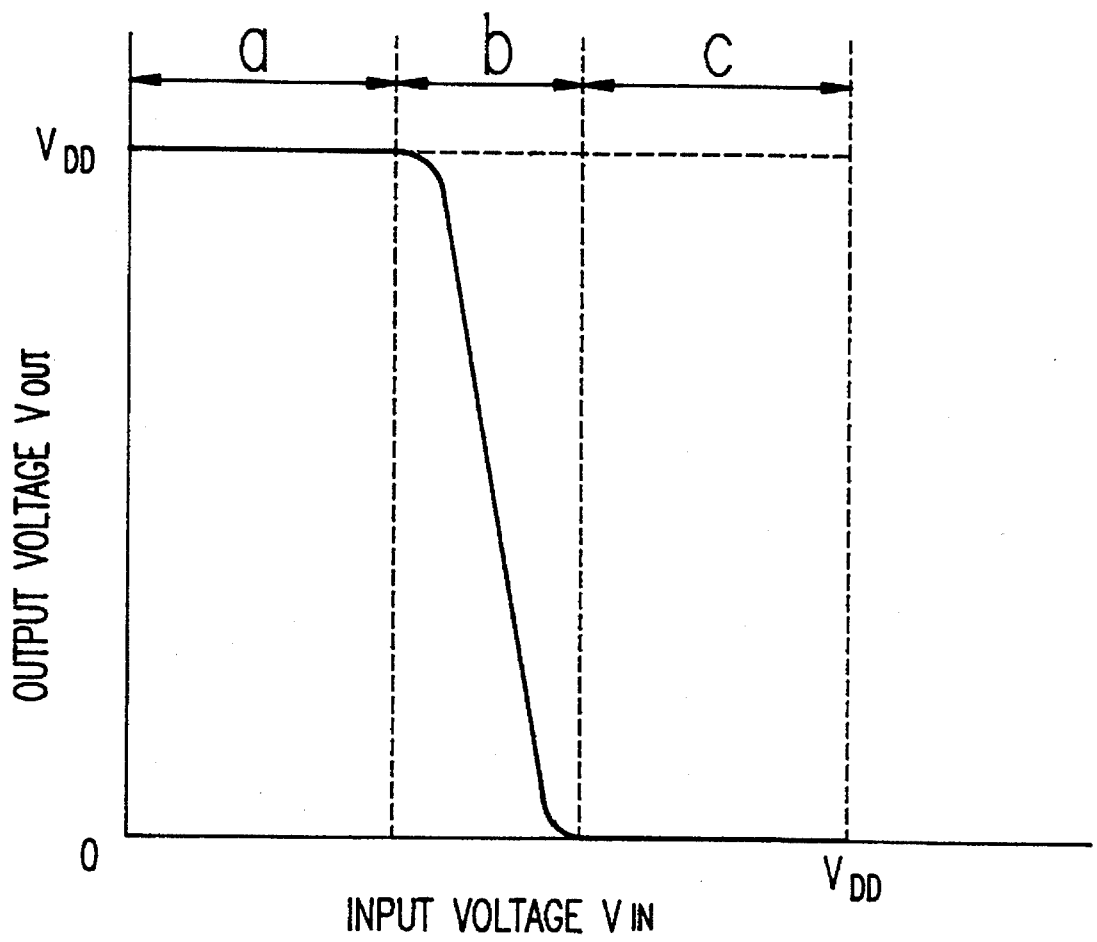
FIG. 3 is a graph illustrating the input/output characteristic of the first clock driver shown in FIG. 1.
Figure 4:
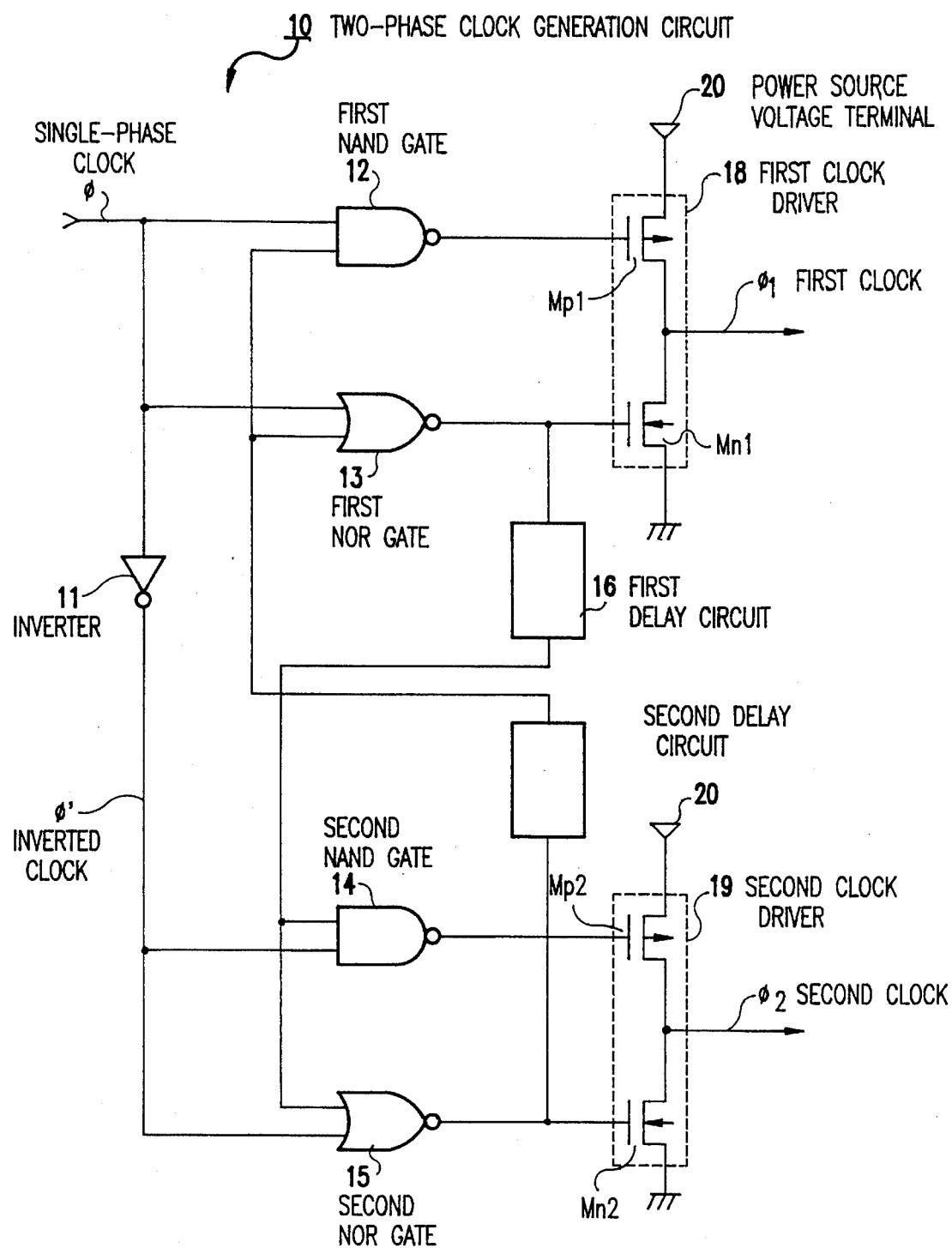
FIG. 4 is a circuit diagram of a two-phase clock generation circuit according to a first embodiment of a polyphase clock generation circuit of the present invention.

A two-phase clock generation circuit 10 according to the first embodiment of a polyphase clock generation circuit of the present invention includes, as shown in FIG. 4, an inverter 11, a first NAND gate 12, a first NOR gate 13, a second NAND gate 14, a second NOR gate 15, a first delay circuit 16, a second delay circuit 17, a first clock driver 18, and a second clock driver 19. The inverter 11 inverts the polarity of a single-phase clock $\phi$ to produce an inverted clock $\phi'$. The first NAND gate 12 negates the logical AND between the single-phase clock $\phi$ and the output signal of the second delay circuit 17. The first NOR gate 13 negates the logical OR between the single-phase clock $\phi$ and the output signal of the second delay circuit 17. The second NAND gate 14 negates the logical AND between the inverted clock $\phi'$ and the output signal of the first delay circuit 16. The second NOR gate 15 negates the logical OR between the inverted clock $\phi'$ and the output signal of the first delay circuit 16. The first delay circuit 16 delays the output signal of the first NOR gate 13 by a predetermined first delay time $dt_1$. The second delay circuit 17 delays the output signal of the second NOR gate 15 by a predetermined second delay time $dt_2$. The first clock driver 18 has the configuration of the CMOS inverter formed from a first PMOS transistor $M_{p1}$ with a gate to which the output signal of the first NAND gate 12 is inputted and a first NMOS transistor $M_{n1}$ with a gate to which the output signal of the first NOR gate 13 is inputted. The first clock driver produces a first clock $\phi_1$ from the output signal of the first NAND gate 12 and the output signal of the first NOR gate 13. The second clock driver 19 has the configuration of a CMOS inverter formed from a second PMOS transistor $M_{p2}$ with a gate to which the output signal of the second NAND gate 14 is inputted and a second NMOS transistor $M_{n2}$ with a gate to which the output signal of the second NOR gate 15 is inputted. The second clock driver produces a second clock $\phi_2$ from the output signal of the second NAND gate 14 and the output signal of the second NOR gate 15. The source of the first PMOS transistor $M_{p1}$ and the source of the second PMOS transistor $M_{p2}$ are both connected to a power source voltage terminal 20. The source of the first NMOS transistor $M_{n1}$ and the source of the second NMOS transistor $M_{n2}$ are both grounded. The drain of the first PMOS transistor $M_{p1}$ and the drain of the first NMOS transistor $M_{n1}$ are connected to each other. The drain of the second PMOS transistor $M_{p2}$ and the drain of the second NMOS transistor $M_{n2}$ are connected to each other.

Figure 5:
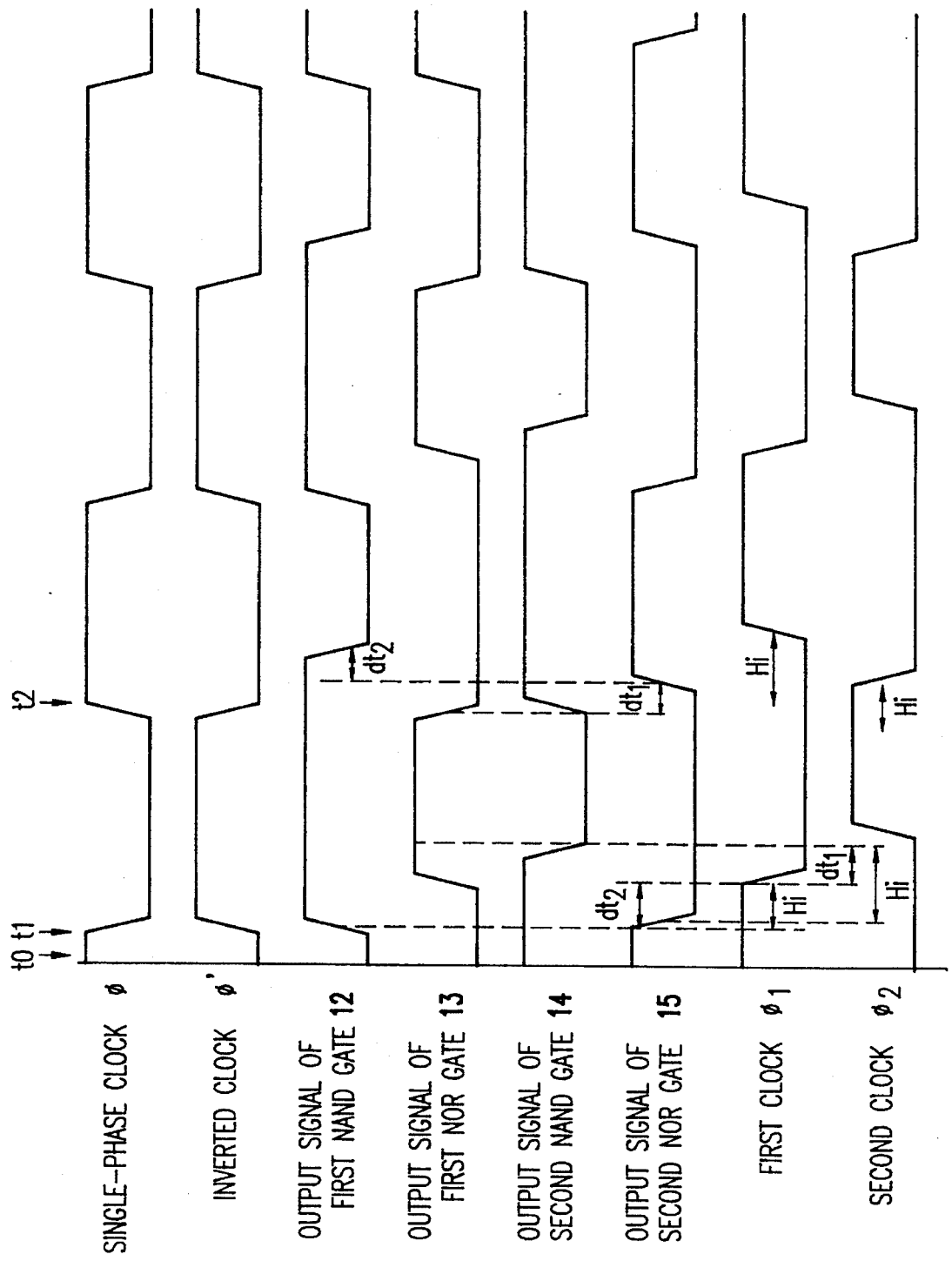
FIG. 5 is a timing chart illustrating operation of the two-phase clock generation circuit shown in FIG. 4.

The operation of the two-phase clock generation circuit 10 is described with reference to the timing chart of FIG. 5. It is assumed that, as an initial stage, sufficient time has passed while the single-phase clock $\phi$ is at high level and the two-phase clock generation circuit 10 is in a stable condition. In this condition, the first clock $\phi_1$ is at high level and the second clock $\phi_2$ is at low level, as shown at time $t_0$ in FIG. 5. The two input signals to the first NOR gate 13 (that is, the single-phase clock $\phi$ and the output signal of the second delay circuit 17) both exhibit high level for a period of time from time $t_0$ to time $t_1$, where $t_1$ represents the time at which the single-phase clock $\phi$ changes from high level to low level. Consequently, the output signal of the first NOR gate 13 is at low level, and the first NMOS transistor $M_{n1}$ is OFF. At this point in time, since the two input signals to the second NAND gate 14 (that is, the inverted clock $\phi'$ and the output signal of the first delay circuit 16) are both at low level, the output signal of the second NAND gate 14 exhibits high level, and the second PMOS transistor $M_{p2}$ is consequently OFF. Thereafter, when the single-phase clock $\phi$ changes to low level at time $t_1$, the output signal of the first NAND gate 12 changes to high level, and the first PMOS transistor $M_{p1}$ is consequently turned OFF. At this point in time, since the inverted clock $\phi'$ outputted from the inverter 11 is at high level, the output signal of the second NOR gate 15 changes to low level, and the second NMOS transistor $M_{n2}$ is consequently turned OFF. Since the output signal of the second NOR gate 15 is inputted to the first NOR gate 13 by way of the second delay circuit 17, the output signal of the first NOR gate 13 changes from low level to high level after the delay of the second delay time $dt_2$ that commences when the output signal of the second NOR gate 15 changes to low level at time $t_1$. As a result, the first NMOS transistor $M_{n1}$ is turned ON, and the first clock $\phi_1$ changes from high level to low level. Since the output signal of the first NOR gate 13 is inputted to the second NAND gate 14 by way of the first delay circuit 16, the output signal of the second NAND gate 14 changes from high level to low level after the delay of the first delay time $dt_1$ that commences when the output signal of the first NOR gate 13 changes to low level. As a result, the second PMOS transistor $M_{p2}$ is turned ON, and the second clock $\phi_2$ changes from low level to high level. In this manner, in the two-phase clock generation circuit 10, the first PMOS transistor $M_{p1}$ constituting the first clock driver 18 and the second NMOS transistor $M_{n2}$ constituting the second clock driver 19 are turned OFF in synchronism with the falling edge of the single-phase clock $\phi$, and the first NMOS transistor $M_{n1}$ is turned ON after the delay substantially of the second delay time $dt_2$ from the falling edge of the single-phase clock $\phi$, and the second PMOS transistor $M_{p2}$ is then turned ON after the delay of a delay time approximately equal to the sum $dt_1+dt_2$ of the first delay time $dt_1$ and the second delay time $dt_2$ from the falling edge of the single-phase clock $\phi$. Accordingly, before the first clock $\phi_1$ changes from high level to low level, a period, shown by a period "Hi" in FIG. 5, within which the output impedance of the first clock driver 18 exhibits high level (that is, the period within which the first PMOS transistor $M_{p1}$ and the first NMOS transistor $M_{n1}$ both exhibit an OFF state) appears. Before the second clock $\phi_2$ changes from low level to high level, a period, shown by a period "Hi" in FIG. 5, within which the output impedance of the second clock driver 19 exhibits high level (that is, the period within which the second PMOS transistor $M_{p2}$ and the second NMOS transistor $M_{n2}$ both exhibit an OFF state) appears.

Thereafter, until the single-phase clock $\phi$ changes to high level at time $t_2$, the two input signals to the NAND gate 12 (that is, the single-phase clock $\phi$ and the output signal of the second delay circuit 17) are both at low level, whereby the output signal of the first NAND gate 12 exhibits high level, and the first PMOS transistor $M_{p1}$ is OFF. Meanwhile, since the two input signals to the second NOR gate 15 (that is, the inverted clock $\phi'$ and the output signal of the first delay circuit 16) are both at high level, the output signal of the second NOR gate 15 presents low level, and the second NMOS transistor $M_{p2}$ is therefore OFF. Thereafter, when the single-phase clock $\phi$ changes from low level to high level at time $t_2$, the output signal of the first NOR gate 13 changes to low level, whereby the first NMOS transistor $M_{n1}$ is turned OFF. At this point in time, the inverted clock $\phi'$ outputted from the inverter 11 changes to low level, whereby the output signal of the second NAND gate 14 changes to high level and the second PMOS transistor $M_{p2}$ is turned OFF. Since the output signal of the first NOR gate 13 is inputted to the second NOR gate 15 by way of the first delay circuit 16, the output signal of the second NOR gate 15 changes from low level to high level after the delay of the first delay time $dt_1$ that commences when the output signal of the first NOR gate 13 changes to low level. As a result, the second NMOS transistor $M_{n2}$ is turned ON, and the second clock $\phi_2$ changes from high level to low level. Meanwhile, since the output signal of the second NOR gate 15 is inputted to the first NAND gate 12 by way of the second delay circuit 17, the output signal of the first NAND gate 12 changes from high level to low level after the delay of the second delay time $dt_2$ that commences when the output signal of the second NOR gate 15 changes to high level. As a result, the first PMOS transistor $M_{p1}$ is turned ON, and the first clock $\phi_1$ changes from low level to high level. In this manner, in the two-phase clock generation circuit 10, the first NMOS transistor $M_{n1}$ and the second PMOS transistor $M_{p2}$ are turned OFF in synchronism with the rising edge of the single-phase clock $\phi$, and after the delay substantially of the first delay time $dt_1$ from the rising edge of the single clock $\phi$, the second NMOS transistor $M_{p2}$ is turned ON, following which the first PMOS transistor $M_{p1}$ is turned ON after a delay time approximately equal to the sum $dt_1+dt_2$ of the first delay time $dt_1$ and the second delay time $dt_2$ from the rising edge of the single-phase clock $\phi$. Accordingly, before the first clock $\phi_1$ changes from low level to high level, a period, shown by a period "Hi" in FIG. 5, within which the output impedance of the first clock driver 18 exhibits high level (that is, the period within which the first PMOS transistor $M_{p1}$ and the first NMOS transistor $M_{n1}$ are both OFF) appears. Before the second clock $\phi_2$ changes from high level to low level, a period, shown by another period "Hi", in FIG. 5, within which the output impedance of the second clock driver 19 exhibits high level (that is, the period within which the second PMOS transistor $M_{p2}$ and the second NMOS transistor $M_{n2}$ are both OFF) appears. Thereafter, operations similar to those from time $t_1$ to time $t_2$ described above take place repetitively. Accordingly, in the two-phase clock generation circuit 10, the first clock $\phi_1$ and the second clock $\phi_2$ do not present an overlapping condition of high level and repeat their level variations in synchronism with the single-phase clock $\phi$. In other words, the first clock $\phi_1$ and the second clock $\phi_2$ make two-phase clocks of active high level.

As is apparent from the foregoing description of the operation, with the two-phase clock generation circuit 10, periods within which the output impedance of the first clock driver 18 exhibit high level can be produced after the rising edge and after the falling edge of the single-phase clock $\phi$ by individually and independently controlling at different times the ON/OFF states of the first PMOS transistor $M_{p1}$ and the first NMOS transistor $M_{n1}$ that constitute the first clock driver 18, and other periods within which the output impedance of the second clock driver 19 exhibit high level can be produced after the rising edge and after the falling edge of the single-phase clock $\phi$ by individually and independently controlling at different timings the ON/OFF states of the second PMOS transistor $M_{p2}$ and the second NMOS transistor $M_{n2}$ that constitute the second clock driver 19. Consequently, through-current which is otherwise produced upon switching of the first clock driver 18 and the second clock driver 19 can be eliminated. As a result, even if the frequency of the single-phase clock $\phi$ is increased, an increase of the through-current which increases in proportion to the increase of the frequency does not occur, and reduction in power dissipation can be achieved. Since a MOS transistor having a channel width of approximately 400 μm and having a very high current supplying capacity is normally used for a system clock driver, for example, for a microcomputer, a through-current with a peak value of 15 to 20 mA flows in conventional polyphase clock generation circuits. In contrast, very little through-current flows in the polyphase clock generation circuit 10. Consequently, the two-phase clock generation circuit 10 allows construction of a system which has low power dissipation, which produces little power source noise or ground noise due to through-current, and which consequently provides highly reliable operation.

Figure 6:
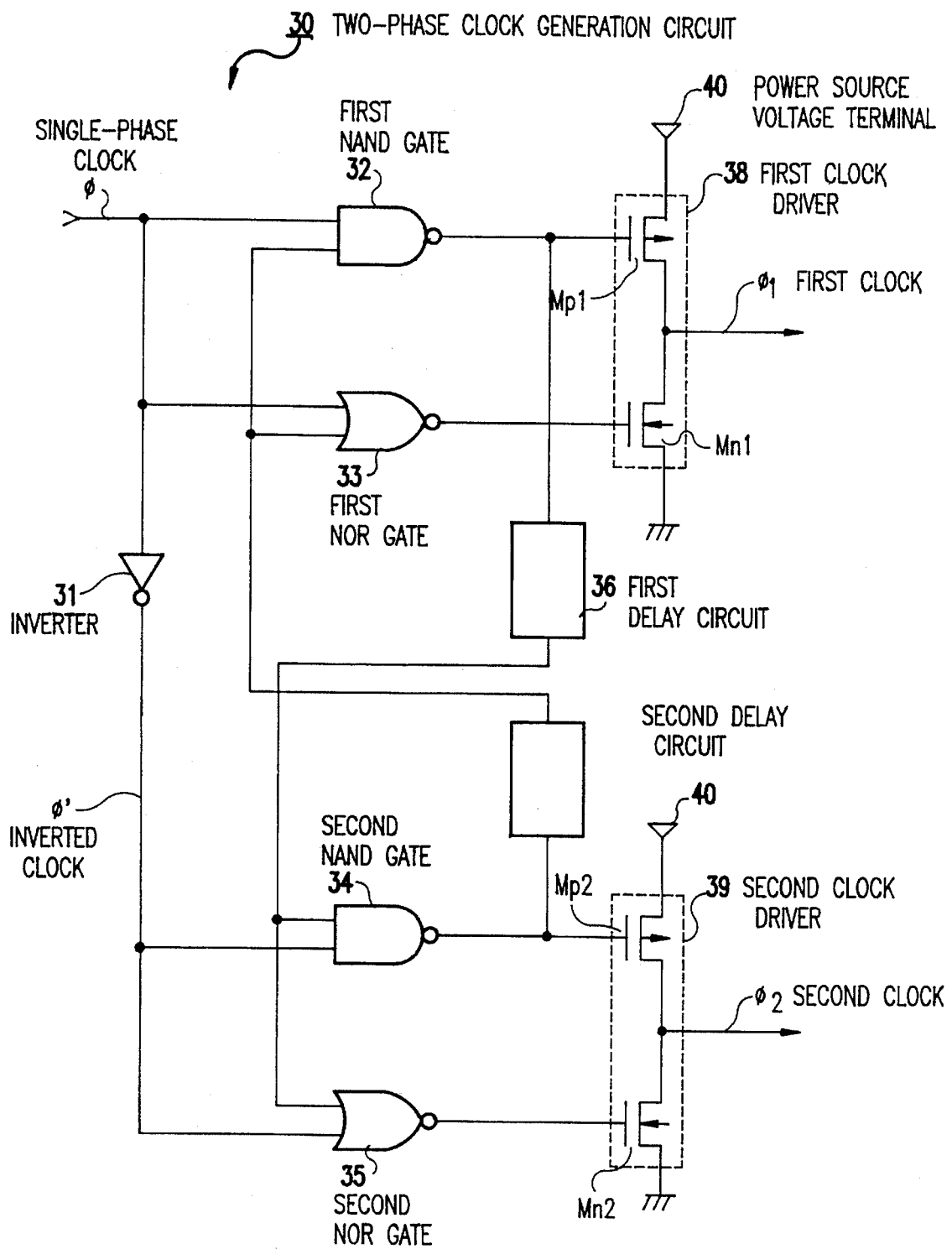
FIG. 6 is a circuit diagram of a two-phase clock generation circuit according to a second embodiment of a polyphase clock generation circuit of the present invention.
Figure 7:
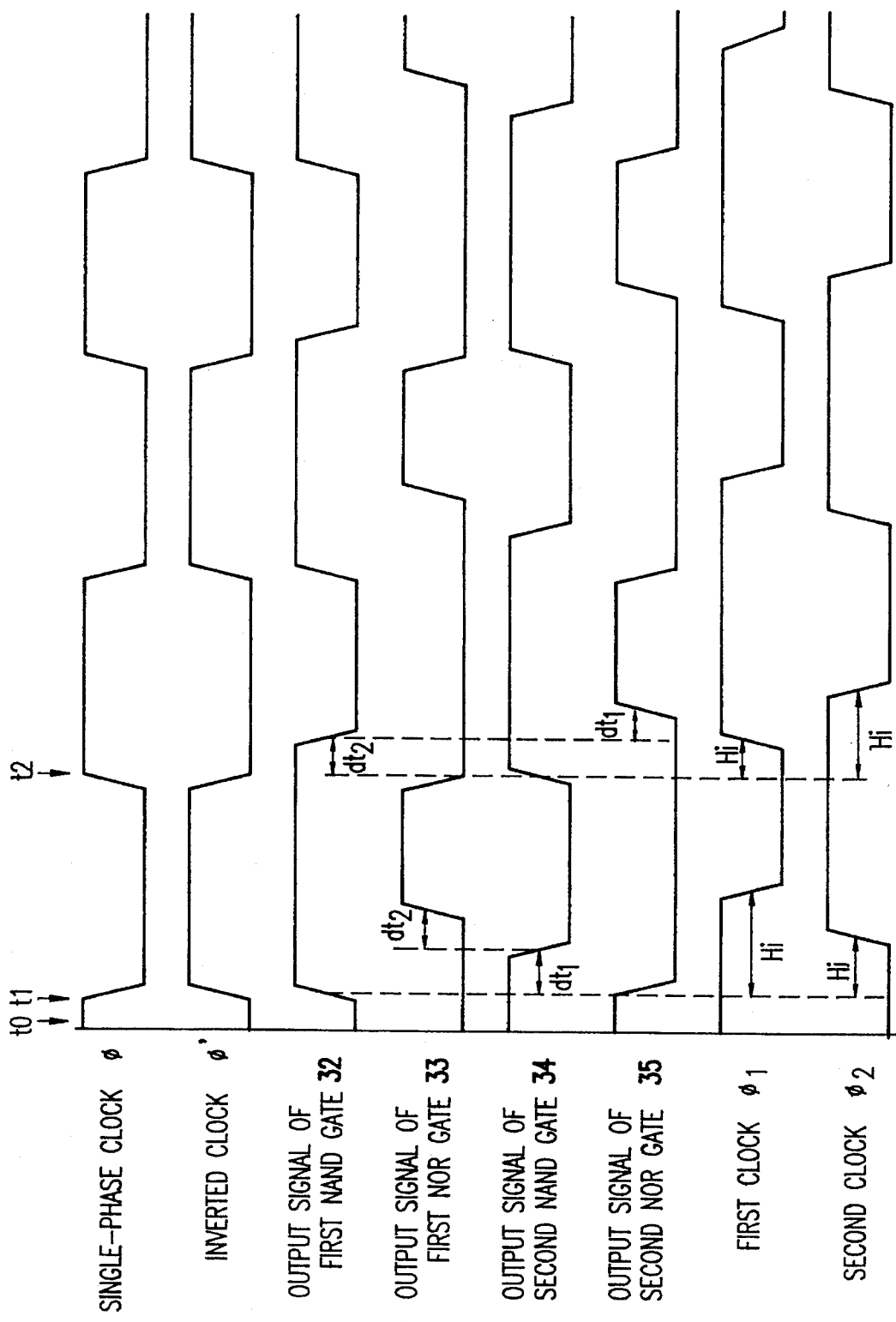
FIG. 7 is a timing chart illustrating operation of the two-phase clock generation circuit shown in FIG. 6.

A two-phase clock generation circuit 30 according to the second embodiment of a polyphase clock generation circuit of the present invention is different from the two-phase clock generation circuit 10 shown in FIG. 4 in that, as shown in FIG. 6, an output signal of a first NAND gate 32 is inputted to a first delay circuit 36 and an output signal of a second NAND gate 34 is inputted to a second delay circuit 37. The operation of the two-phase clock generation circuit 30 shown in FIG. 6 is described with reference to the timing chart shown in FIG. 7. It is assumed that, as an initial state, sufficient time has passed while the single-phase clock $\phi$ is at high level and the two-phase clock generation circuit 30 is in a stable condition. In this condition, the first clock $\phi_1$ exhibits high level and the second clock $\phi_2$ exhibits low level as shown at time $t_0$ of FIG. 7.

The two input signals to the first NOR gate 33 (that is, the single-phase clock $\phi$ and the output signal of the second delay circuit 37) both exhibit high level for a period of time from time $t_0$ to time $t_1$, where the time at which the single-phase clock $\phi$ changes from high level to low level is represented by $t_1$. Consequently, the output signal of the first NOR gate 33 is at low level, and the first NMOS transistor $M_{n1}$ constituting the first clock driver 38 is OFF. At this point of time, since the two input signals to the second NAND gate 34 (that is, the inverted clock $\phi'$ and the output signal of the first delay circuit 36) are both at low level, the output signal of the second NAND gate 34 exhibits high level and the second PMOS transistor $M_{p2}$ constituting the second clock driver 39 is OFF. Thereafter, when the single-phase clock $\phi$ changes to low level at time $t_1$, the output signal of the first NAND gate 32 changes to high level and the first PMOS transistor $M_{p1}$ constituting the first clock driver 38 is turned OFF. At this point of time, since the inverted clock $\phi'$ outputted from the inverter 31 changes to high level, the output signal of the second NOR gate 35 changes to low level, and the second NMOS transistor $M_{n2}$ constituting the second clock driver 39 is turned OFF. Since the output signal of the first NAND gate 32 is inputted to the second NOR gate 34 by way of the first delay circuit 36, the output signal of the second NAND gate 34 changes from high level to low level after the first delay time $dt_1$ that commences when the output signal of the first NAND gate 32 changes to low level. As a result, the second PMOS transistor $M_{p2}$ is turned ON, and the second clock $\phi_2$ changes from low level to high level. Further, since the output signal of the second NAND gate 34 is inputted to the first NOR gate 33 by way of the second delay circuit 37, the output signal of the first NOR gate 33 changes from low level to high level after the delay of the second delay time $dt_2$ that commences when the output signal of the second NAND gate 34 changes to low level at time $t_1+dt_1$. As a result, the first NMOS transistor $M_{n1}$ is turned ON, and the first clock $\phi_1$ changes from high level to low level. In this manner, in the two-phase clock generation circuit 30, the first PMOS transistor $M_{p1}$ and the second NMOS transistor $M_{n2}$ are turned OFF in synchronism with the falling edge of the single-phase clock $\phi$, and the second PMOS transistor $M_{p2}$ is turned ON after a delay approximately equal to the first delay time $dt_1$ from the falling edge of the single-phase clock $\phi$, following which the first NMOS transistor $M_{n1}$ is turned ON after the delay time approximately equal to the sum $dt_1+dt_2$ of the first delay time $dt_1$ and the second delay time $dt_2$ from the falling edge of the single-phase clock $\phi$. Accordingly, before the first clock $\phi_1$ changes from high level to low level, a period appears within which the output impedance of the first clock driver 38 exhibits high level (that is, the period within which the first PMOS transistor $M_{p1}$ and the first NMOS transistor $M_{n1}$ both exhibit an OFF state). The period is identified in FIG. 7 as a "HI" period. Before the second clock $\phi_2$ changes from low level to high level, a period appears within which the output impedance of the second clock driver 39 exhibits high level (that is, the period within which the second PMOS transistor $M_{p2}$ and the second NMOS transistor $M_{n2}$ both exhibit an OFF state). This period is also identified as a "HI" period in FIG. 7.

Thereafter, the single-phase clock $\phi$ changes to high level at time $t_2$, the two input signals to the first NAND gate 32 (that is, the single-phase clock $\phi$ and the output signal of the second delay circuit 37) are both at low level, and consequently, the output signal of the first NAND gate 32 exhibits high level and the first PMOS transistor $M_{p1}$ is OFF.

Meanwhile, since the two input signals to the second NOR gate 35 (that is, the inverted clock signal φ' and the output signal of the first delay circuit 36) are both at high level, the output signal of the second NOR gate 35 presents low level, and the second NMOS transistor $M_{p2}$ is OFF. Thereafter, when the single-phase clock φ changes from low level to high level at time $t_2$, the output signal of the first NOR gate 33 changes to low level, and the first NMOS transistor $M_{n1}$ is consequently turned OFF. At this point in time, the inverted clock φ' outputted from the inverter 31 changes to low level, and consequently, the output signal of the second NAND gate 34 changes to high level, and the second PMOS transistor $M_{p2}$ is turned OFF. Since the output signal of the second NAND gate 34 is inputted to the first NAND gate 32 by way of the second delay circuit 37, the output signal of the first NAND gate 32 changes from low level to high level after the delay of the second delay time $dt_2$ that commences when the output signal of the second NAND gate 34 changes to high level. As a result, the first NMOS transistor $M_{p1}$ is turned ON, and the first clock $φ_1$ changes from low level to high level. Meanwhile, since the output signal of the first NAND gate 32 is inputted to the second NOR gate 35 by way of the first delay circuit 36, the output signal of the second NOR gate 35 changes from high level to low level after the delay of the first delay time $dt_1$ beginning when the output signal of the first NAND gate 32 changes to low level. As a result, the second NMOS transistor $M_{n2}$ is turned ON, and the second clock $φ_2$ changes from high level to low level. In this manner, in the two-phase clock generation circuit 30, the first NMOS transistor $M_{n1}$ and the second PMOS transistor $M_{p2}$ are turned OFF in synchronism with the rising edge of the single-phase clock φ, and after a delay approximately equal to the second delay time $dt_2$ from the rising edge of the single clock φ, the first PMOS transistor $M_{p1}$ is turned ON, following which the second NMOS transistor $M_{p2}$ is turned ON after a delay time approximately equal to the sum $dt_1+dt_2$ of the first delay time $dt_1$ and the second delay time $dt_2$ from the rising edge of the single-phase clock φ. Accordingly, before the first clock $φ_1$ changes from low level to high level, a period within which the output impedance of the first clock driver 38 exhibits high level appears (that is, the period within which the first PMOS transistor $M_{p1}$ and the first NMOS transistor $M_{n1}$ are both off). This period is identified as a "HI" period in FIG. 7. Before the second clock $φ_2$ changes from high level to low level, a period within which the output impedance of the second clock driver 39 exhibits high level appears (that is, the period within which the second PMOS transistor $M_{p2}$ and the second NMOS transistor $M_{n2}$ are both off). This period is shown as another "HI" period in FIG. 7.

Thereafter, operations similar to the above-described operations from time $t_1$ to time $t_2$ take place repetitively. Accordingly, in the two-phase clock generation circuit 30, the first clock $φ_1$ and the second clock $φ_2$ do not present an overlapping condition of high level and repeat their level variations in synchronism with the single-phase clock φ. In other words, the first clock $φ_1$ and the second clock $φ_2$ make two-phase clocks of active high level. In the two-phase clock generation circuit 30, periods within which the output impedance of the first clock driver 38 exhibit high level can be produced after the rising edge and after the falling edge of the single-phase clock φ by individually and independently controlling at different timings the ON/OFF states of the first PMOS transistor $M_{p1}$ and the first NMOS transistor $M_{n1}$ that constitute the first clock driver 38, and other periods within which the output impedance of the second clock driver 39 exhibit high level can be produced after the rising edge and after the falling edge of the single-phase clock φ by individually and independently controlling at different timings the ON/OFF states of the second PMOS transistor $M_{p2}$ and the second NMOS transistor $M_{n2}$, which constitute the second clock driver 39. Consequently, through-current which may otherwise be produced upon switching of the first clock driver 38 and the second clock driver 39 can be eliminated.

Figure 8:
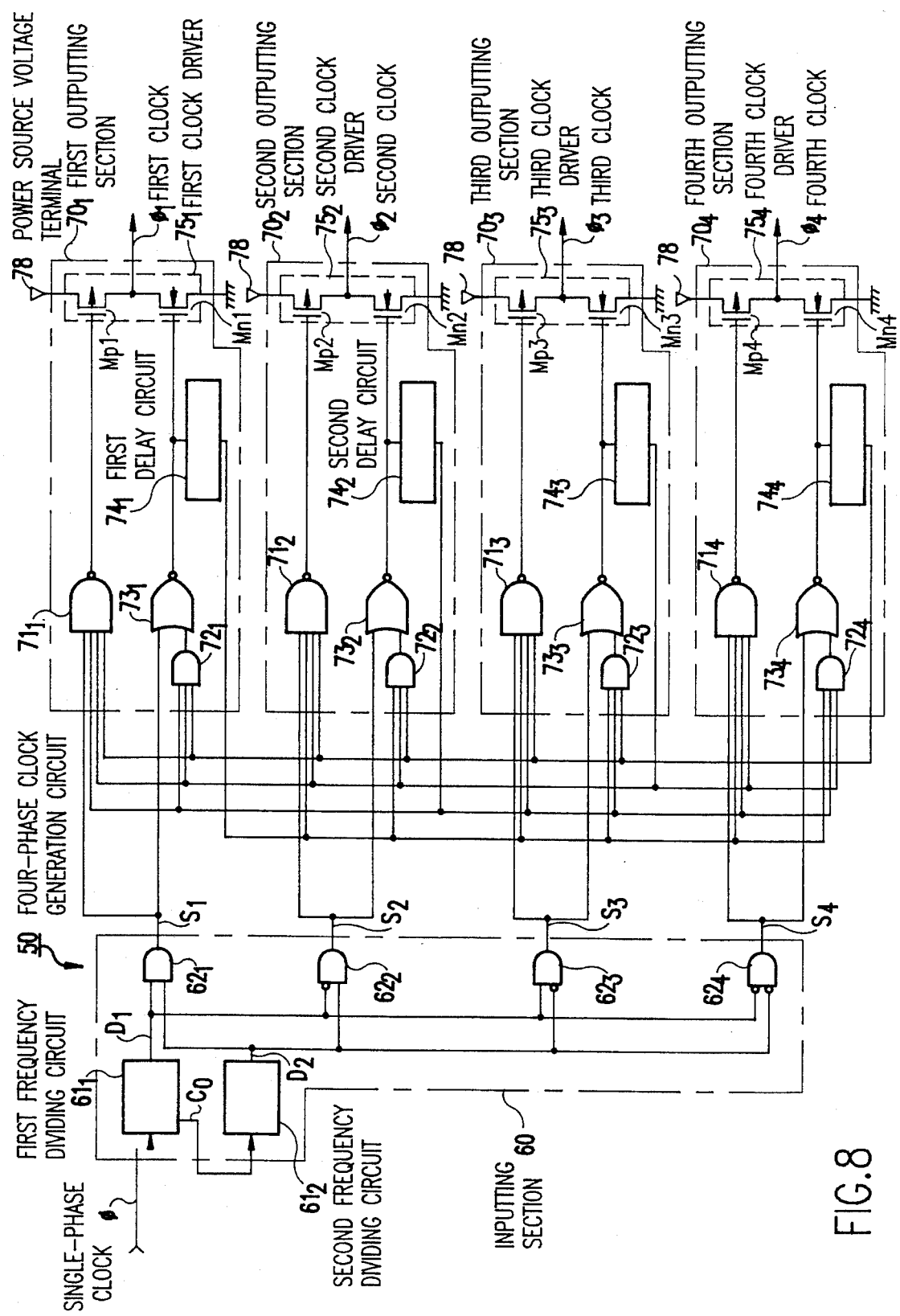
FIG. 8 is a circuit diagram of a four-phase clock generation circuit according to a third embodiment of a polyphase clock generation circuit of the present invention.

A four-phase clock generation circuit 50 according to the third embodiment of a polyphase clock generation circuit of the present invention includes, as shown in FIG. 8, an inputting section 60, a first outputting section $70_1$, a second outputting section $70_2$, a third outputting section $70_3$, and a fourth outputting section $70_4$. The inputting section 60 includes a first frequency dividing circuit $61_1$ for doubling a frequency of a single-phase clock φ, a second frequency dividing circuit $61_2$ for doubling a frequency of a carrier signal $C_0$ of the first frequency dividing circuit $61_1$, a first AND gate $62_1$ for outputting an output signal $S_1$ of high level when both the output signal $D_1$ of the first frequency dividing circuit $61_1$ and the output signal $D_2$ of the second frequency dividing circuit $61_2$ exhibit high level, a second AND gate $62_2$ for outputting an output signal $S_2$ of high level when the output signal $D_1$ of the first frequency dividing circuit $61_1$ exhibits low level and the output signal $D_2$ of the second frequency dividing circuit $61_2$ exhibits high level, a third AND gate $62_3$ for outputting an output signal $S_3$ of high level when the output signal $D_1$ of the first frequency dividing circuit $61_1$ exhibits high level and the output signal $D_2$ of the second frequency driving circuit $61_2$ exhibits low level, and a fourth AND gate $62_4$ for outputting an output signal $S_4$ of high level when both the output signal $D_1$ of the first frequency dividing circuit $61_1$ and the output signal $D_2$ of the second frequency dividing circuit $61_2$ exhibit low level. The first outputting section $70_1$ includes a first NAND gate $71_1$, a fifth AND gate $72_1$, a first NOR gate $73_1$, a first delay circuit $74_1$ to which the output signal of the first NOR gate $73_1$ is inputted, and a first clock driver $75_1$ formed from a first PMOS transistor $M_{p1}$ and a first NMOS transistor $M_{n1}$. The output signal of the first NAND gate $71_1$ is inputted to the gate of the first PMOS transistor $M_{p1}$, and the source of the first PMOS transistor $M_{p1}$ is connected to a power source voltage terminal 78. The output signal of the first NOR gate $73_1$ is inputted to the gate of the first NMOS transistor $M_{n1}$, and the source of the first NMOS transistor $M_{n1}$ is grounded. The drain of the first NMOS transistor $M_{n1}$ is connected to the drain of the first PMOS transistor $M_{p1}$, and a first clock $φ_1$ is outputted from the junction between them. The second outputting section $70_2$, the third outputting section $70_3$, and the fourth outputting section $70_4$ are each constructed similarly to the first outputting section $70_1$. The first NAND gate $71_1$ of the first outputting section $70_1$ negates the logical AND among the output signal $S_1$ of the first AND circuit $62_1$, the output signal of the second delay circuit $74_2$ of the second outputting section $70_2$, the output signal of the third delay circuit $74_3$ of the third outputting section $70_3$, and the output signal of the fourth delay circuit $74_4$ of the fourth outputting section $70_4$. The fifth AND gate $72_1$ of the first outputting section $70_1$ logically ANDs the output signal of the second delay circuit $74_2$ of the second outputting section $70_2$, the output signal of the third delay circuit $74_3$ of the third outputting section $70_3$, and the output signal of the fourth delay circuit $74_4$ of the fourth outputting section $70_4$. The first NOR gate $73_1$ of the first outputting section $70_1$ negates the logical OR between the output signal $S_1$ of the first AND circuit $62_1$ and the output signal of the fifth AND gate $72_1$. The second NAND gate $71_2$ of the second outputting section $70_2$ negates the logical AND among the output signal $S_2$ of the second AND gate $62_2$, the output signal of the first delay circuit $74_1$ of the first outputting section $70_1$, the output signal of the third delay circuit $74_3$ of the third outputting section $70_3$ and the output signal of the fourth delay circuit $74_4$ of the fourth outputting section $70_4$. The sixth AND gate $72_2$ of the second outputting section $70_2$ logically ANDs the output signal of the first delay circuit $74_1$ of the first outputting section $70_1$, the output signal of the third delay circuit $74_3$ of the third outputting section $70_3$ and the output signal of the fourth delay circuit $74_4$ of the fourth outputting section $70_4$. The second NOR gate $73_2$ of the second outputting section $70_2$ negates the logical OR between the output signal $S_2$ of the second AND gate $62_2$ and the output signal of the sixth AND gate $72_2$. The third NAND gate $71_3$ of the third outputting section $70_3$ negates the logical AND among the output signal $S_3$ of the third AND gate $62_3$, the output signal of the first delay circuit $74_1$ of the first outputting section $70_1$, the output signal of the second delay circuit $74_2$ of the second outputting section $70_2$ and the output signal of the fourth delay circuit $74_4$ of the fourth outputting section $70_4$. The seventh AND gate $72_3$ of the third outputting section $70_3$ logically ANDs the output signal of the first delay circuit $74_1$ of the first outputting section $70_1$, the output signal of the second delay circuit $74_2$ of the second outputting section $70_2$, and the output signal of the fourth delay circuit $74_4$ of the fourth outputting section $70_4$. The third NOR gate $73_3$ of the third outputting section $70_3$ negates the logical AND between the output signal $S_3$ of the third AND gate $62_3$ and the output signal of the seventh AND gate $72_3$. The fourth NAND gate $71_4$ of the fourth outputting section $70_4$ negates the logical AND among the output signal $S_4$ of the fourth AND gate $62_4$, the output signal of the first delay circuit $74_1$ of the first outputting section $70_1$, the output signal of the second delay circuit $74_2$ of the second outputting section $70_2$ and the output signal of the third delay circuit $74_3$ of the third outputting section $70_3$. The eighth AND gate $72_4$ of the fourth outputting section $70_4$ logically ANDs the output signal of the first delay circuit $74_1$ of the first outputting section $70_1$, the output signal of the second delay circuit $74_2$ of the second outputting section $70_2$, and the output signal of the third delay circuit $74_3$ of the third outputting section $70_3$. The fourth NOR gate $73_4$ of the fourth outputting section $70_4$ negates the logical OR between the output signal $S_4$ of the fourth AND gate $62_4$ and the output signal of the eighth AND gate $72_4$.

The operation of the four-phase clock generation circuit 50 is described with reference to the timing chart shown in FIG. 9. The first frequency dividing circuit $61_1$ outputs the output signal $D_1$ synchronized with the falling edge of the single-phase clock $\phi$ and outputs the carrier signal $C_0$ synchronized with the rising edge of the single-phase clock $\phi$. The second frequency driving circuit $61_2$ outputs the output signal $D_2$ synchronized with the falling edge of the carrier signal $C_0$. The output signal $D_1$ of the first frequency dividing circuit $61_1$ changes from low level to high level when the single-phase clock $\phi$ falls at time $t_1$ and then changes from high level to low level when the single-phase clock $\phi$ falls again at time $t_3$. The output signal $D_1$ of the first frequency dividing circuit $61_1$ repeats the level variation for each two clock pulses of the single-phase clock $\phi$. The carrier signal $C_0$ of the first frequency dividing circuit $61_1$ changes from low level to high level when the single-phase clock $\phi$ rises at time $t_2$, and then changes from high level to low level when the single-phase clock $\phi$ falls at time $t_3$. The carrier signal $C_0$ of the first frequency dividing circuit $61_1$ repeats the level variation for each two clock pulses of the single-phase clock $\phi$. The output signal $D_2$ of the second frequency driving circuit $61_2$ changes from low level to high level when the carrier signal $C_0$ falls at time $t_3$ and then changes from low level to high level when the carrier signal $C_0$ falls again at time $t_4$. The output signal $D_2$ of the second frequency driving circuit $61_2$ repeats the level variation for each two clock pulses of the carrier signal $C_0$, that is, for each four clock pulses of the single-phase clock $\phi$. As a result, as the logical ANDs between the output signal $D_1$ of the first frequency dividing circuit $61_1$ and the output signal $D_2$ of the second frequency driving circuit $61_2$ are calculated individually by the first to fourth AND gates $62_1$–$62_4$ as described above, the output signals $S_1$–$S_4$ which have a high-level period equal to one period of the single-phase clock $\phi$ and are successively displaced from each other by one clock distance (the period of one clock pulse) of the single-phase clock $\phi$ as shown in FIG. 9 are outputted.

Figure 9:
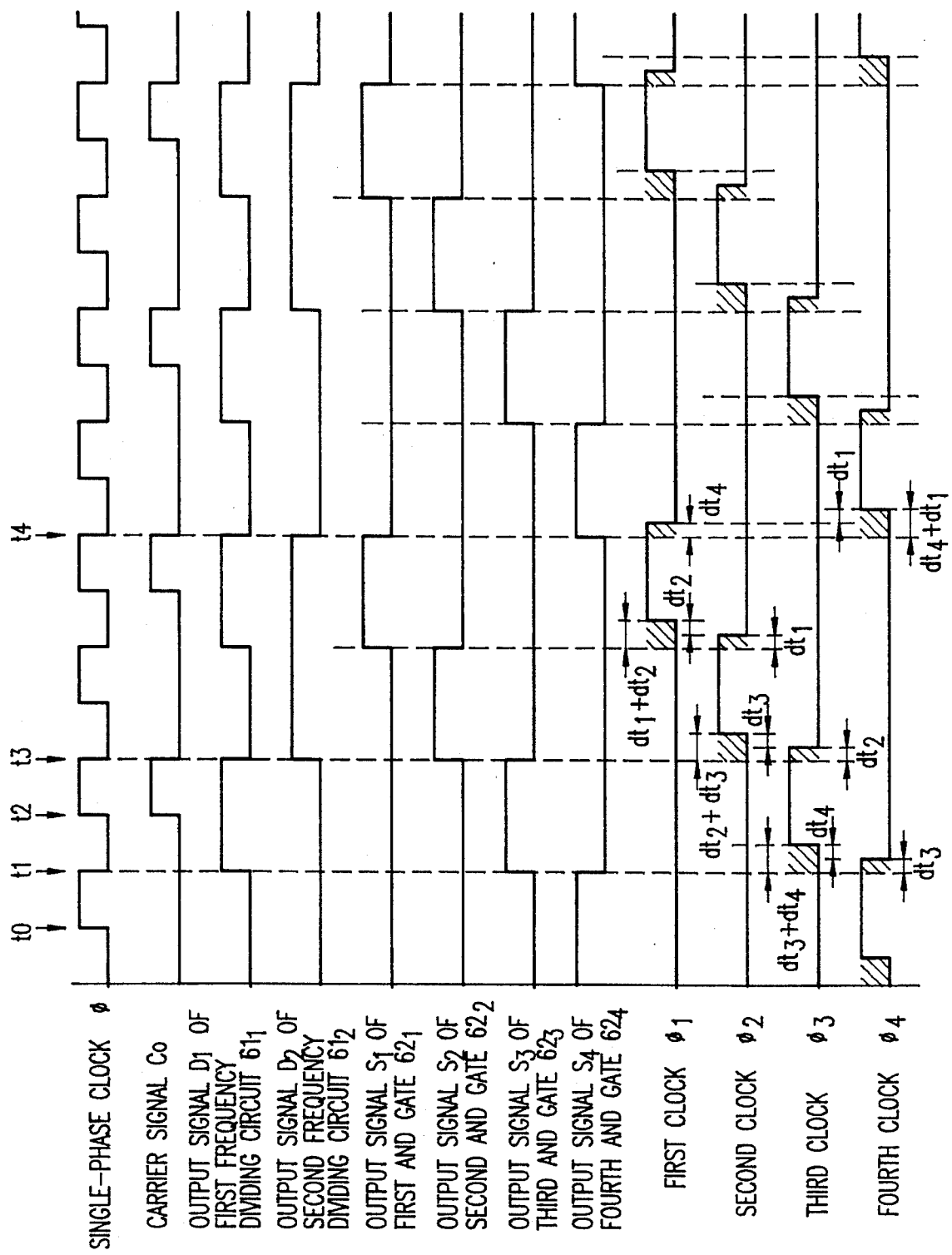
FIG. 9 is a timing chart illustrating operation of the two-phase clock generation circuit shown in FIG. 8.

It is assumed that at time $t_0$ shown in FIG. 9, first to third clocks $\phi_1$–$\phi_3$ all exhibit low level while the fourth clock $\phi_4$ exhibits high level. When the single-phase clock $\phi$ falls at time $t_1$, the output signal $D_1$ of the first frequency dividing circuit $61_1$ changes from low level to high level, whereby the output signal $S_3$ of the third AND gate $62_3$ changes from low level to high level and the output signal $S_4$ of the fourth AND gate $62_4$ changes from high level to low level. Nevertheless, the output signal $S_1$ of the first AND circuit $62_1$ and the output signal $S_2$ of the second AND gate $62_2$ remain at low level. As a result, when the output signal $S_4$ of the fourth AND gate $62_4$ changes to low level, the output signal of the fourth NAND gate $71_4$ of the fourth outputting section $70_4$ changes from low level to high level, and consequently, the fourth PMOS transistor $M_{p4}$ constituting the fourth clock driver $75_4$ is turned OFF. At time $t_1$, the three input signals to the eighth AND gate $72_4$ of the fourth outputting section $70_4$, that is, the output signal of the first delay circuit $74_1$, the output signal of the second delay circuit $74_2$, and the output signal of the third delay circuit $74_3$, all exhibit high level, and consequently, the output signal of the eighth AND gate $72_4$ exhibits high level. As a result, the output signal of the fourth NOR gate $73_4$ exhibits low level, and the fourth NMOS transistor $M_{n4}$ constituting the fourth clock driver $75_4$ is OFF. However, when the output signal $S_3$ of the third AND gate $62_3$ changes to high level at time $t_1$, the output signal of the third NOR gate $73_3$ of the third outputting section $70_3$ changes to low level. Since the output signal of the third NOR gate $73_3$ is inputted to the eighth AND gate $72_4$ of the fourth outputting section $70_4$ by way of the third delay circuit $74_3$, the output signal of the eighth AND gate $72_4$ changes to low level after the delay time $dt_3$ of the third delay circuit $74_3$ from time $t_1$. Accordingly, at time $t_1+dt_3$, the output signal $S_4$ of the fourth AND gate $62_4$ and the output signal of the eighth AND gate $72_4$, which are the two input signals to the fourth NOR gate $73_4$, both change to low level, and the output signal of the fourth NOR gate $73_4$ consequently changes from low level to high level and the fourth NMOS transistor $M_{n4}$ constituting the fourth clock driver $75_4$ is turned ON. As a result, the fourth clock $\phi$ 4 outputted from the fourth clock driver $75_4$ changes from high level to low level. Consequently, with the four-phase clock generation circuit 50, a period within which the output impedance of the fourth delay circuit $74_4$ exhibits high level can be assured for the delay time $dt_3$ of the third delay circuit $74_3$ immediately before the falling edge of the fourth clock $\phi_4$.

Since the output signal of the fourth delay circuit $74_4$ among the three input signals to the seventh AND gate $72_3$ of the third outputting section $70_3$ is at low level before time $t_1$, the output signal of the seventh AND gate $72_3$ is at low level. Since the output signal $S_3$ of the third AND gate $62_3$ is also at low level, the output signal of the third NOR gate $73_3$ is at high level, and the third NMOS transistor $M_{n3}$ constituting the third clock driver $75_3$ is ON. However, when the output signal $S_3$ of the third AND gate $62_3$ changes to high level at time $t_1$, the output signal of the third NOR gate $73_3$ changes to low level, and consequently, the third NMOS transistor $M_{n3}$ constituting the third clock driver $75_3$ is turned OFF. On the other hand, when the output signal $S_3$ of the third AND gate $62_3$ changes to high level at time $t_1$, only the output signal of the fourth delay circuit $74_4$ among the four input signals to the third NAND gate $71_3$ of the third outputting section $70_3$ changes to low level. Although the output signal of the fourth NOR gate $73_4$ of the fourth outputting section $70_4$ changes from low level to high level at time $t_1+dt_3$ as described above, since the output signal of the fourth NOR gate $73_4$ is inputted to the third NAND gate $71_3$ by way of the fourth delay circuit $74_4$, the four input signals to the third NAND gate $71_3$ all change to high level after the delay time $dt_4$ of the fourth delay circuit $74_4$ from time $t_1+dt_3$. As a result, at time $t_1+dt_3+dt_4$, the output signal of the third NAND gate $71_3$ changes from high level to low level, the third PMOS transistor $M_{p3}$ constituting the third clock driver $75_3$ is turned ON, and the third clock $\phi_3$ outputted from the third clock driver $75_3$ changes from low level to high level. Consequently, with the four-phase clock generation circuit 50, a period within which the output impedance of the third delay circuit $74_3$ exhibits high level can be assured for the delay time of the sum $dt_3+dt_4$ of the delay time $dt_3$ of the third delay circuit $74_3$ and the delay time $dt_4$ of the fourth delay circuit $74_4$ immediately before the rising edge of the third clock $\phi_3$.

Similarly, with the four-phase clock generation circuit 50, a period within which the output impedance of the third clock driver $75_3$ exhibits high level can be assured for the delay time $dt_2$ of the second delay circuit $74_2$ immediately before the falling edge of the third clock $\phi_3$ as shown by slanting lines in FIG. 9; another period within which the output impedance of the second clock driver $75_2$ exhibits high level can be assured for the delay time sum $dt_2+dt_3$ of the delay time $dt_2$ of the second delay circuit $74_2$ and the delay time $dt_3$ of the third delay circuit $74_3$ immediately before the rising edge of the second clock $\phi_2$; a further period within which the output impedance of the second clock driver $75_2$ exhibits high level can be assured by the delay time $dt_1$ of the first delay circuit $74_1$ immediately before the falling edge of the second clock $\phi_2$; a still further period within which the output impedance of the first clock driver $75_1$ exhibits high level can be assured for the delay time sum $dt_1+dt_2$ of the delay time $dt_1$ of the first delay circuit $74_1$ and the delay time $dt_2$ of the second delay circuit $74_2$ immediately before the rising edge of the first clock $\phi_1$; a yet further period within which the output impedance of the first clock driver $75_1$ can be assured by the delay time $dt_4$ of the fourth delay circuit $74_4$ immediately before the falling edge of the first clock $\phi_1$; and a yet further period within which the output impedance of the fourth clock driver $75_4$ exhibits high level can be assured by the delay time sum $dt_4+dt_1$ of the delay time $dt_4$ of the fourth delay circuit $74_4$ and the delay time $dt_1$ of the first delay circuit $74_1$ immediately before the rising edge of the fourth clock $\phi_4$.

It is to be noted that, while a detailed description is omitted, where the frequency dividing circuits of the inputting section are provided by three stages, an eight-phase clock signal can be generated with a similar construction to that of the four-phase clock generation circuit 50.

Figure 10:
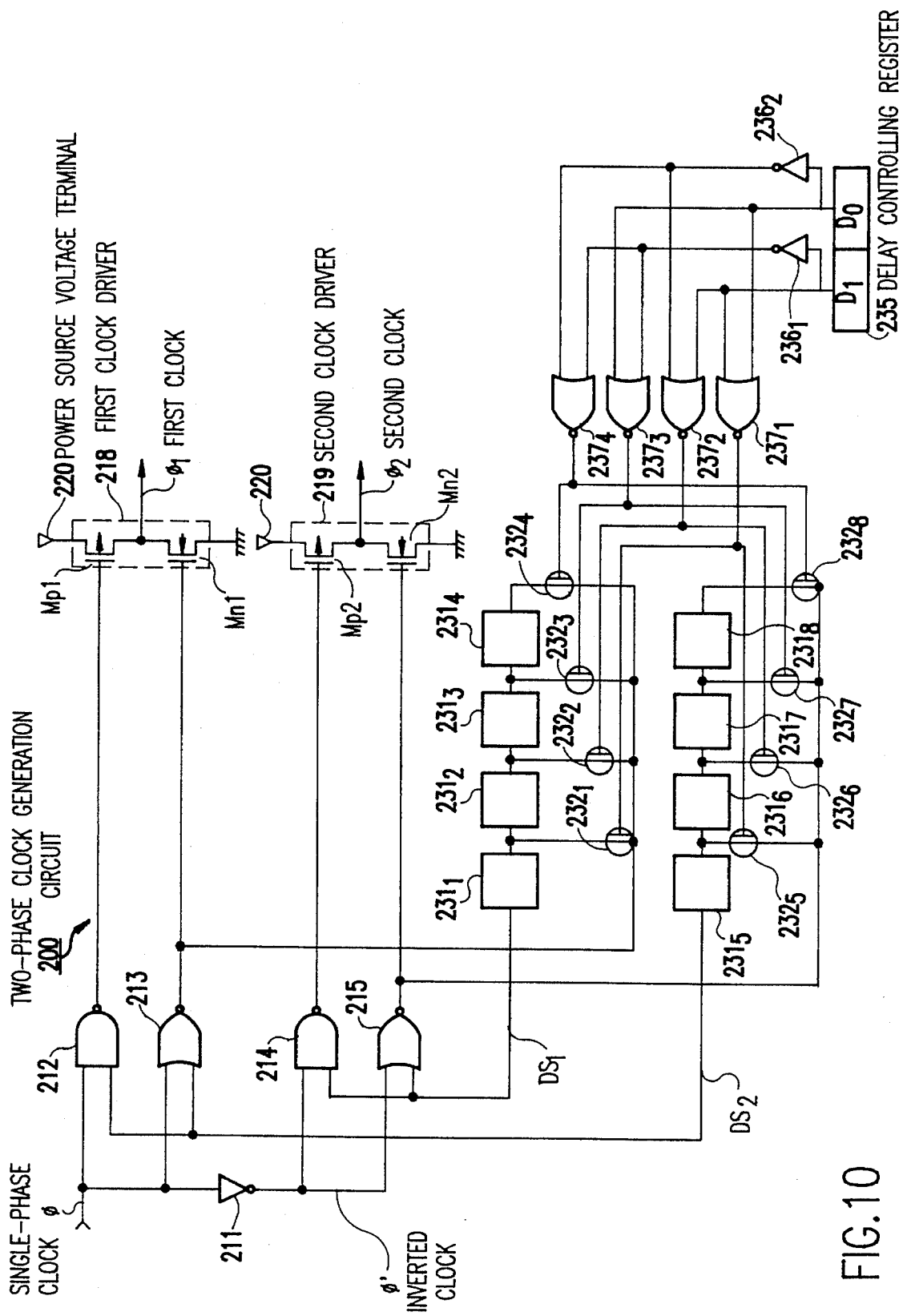
FIG. 10 is a circuit diagram of a two-phase clock generation circuit according to a fourth embodiment of a polyphase clock generation circuit of the present invention.

A two-phase clock generation circuit 200 according to the fourth embodiment of a polyphase clock generation circuit of the present invention is different from the two-phase clock generation circuit 10 shown in FIG. 4 in that, as shown in FIG. 10, it includes a delay time setting section in place of the first delay circuit 16 and the second delay circuit 17. Here, the delay time setting section includes first to fourth delay circuits $231_1$–$231_4$ connected in series to each other, first to fourth transfer gates $232_1$–$232_4$ interposed between an output terminal of a first NOR gate 213 and the input terminals of the first to fourth delay circuits $231_1$–$231_4$, respectively, fifth to eighth delay circuits $231_5$–$231_8$ connected in series to each other, fifth to eighth transfer gates $232_5$–$232_8$ interposed between an output terminal of a second NOR gate 215 and the input terminals of the fifth to eighth delay circuits $231_5$–$231_8$, respectively, a delay controlling register $23_5$ into which are stored delay control data constituted from an upper bit $D_1$ and a lower signal $D_2$, a first delay controlling inverter $236_1$ for inverting the polarity of the upper bit $D_1$ of the delay control data outputted from the delay controlling register 235, a second delay controlling inverter $236_2$ for inverting the polarity of the lower bit $D_2$ of the delay control data outputted from the delay controlling register 235, and first to fourth delay controlling NOR gates $237_1$–$237_4$. Here, the output signal $DS_1$ of the first delay circuit $231_1$ is inputted to a second NAND gate 214 and a second NOR gate 215. The output signal $DS_2$ of the fifth delay circuit $231_5$ is inputted to a first NAND gate 212 and the first NOR gate 213. Meanwhile, the first delay controlling NOR gate $237_1$ turns ON the first transfer gate $232_1$ and the fifth transfer gate $232_5$ when both the upper bit $D_1$ and the lower bit $D_2$ of the delay control data inputted thereto from the delay controlling register 235 exhibit low level. The second delay controlling NOR gate $237_2$ turns ON the second transfer gate $232_2$ and the sixth transfer gate $232_6$ when the upper bit $D_1$ of the delay control data inputted thereto from the delay controlling register 235 and an inverted signal of the lower bit $D_2$ of the delay control data inputted thereto from the second delay controlling inverter $236_2$ both exhibit low level. The third delay controlling NOR gate $237_3$ turns ON the third transfer gate $232_3$ and the seventh transfer gate $232_7$ when both an inverted signal of the upper bit $D_1$ of the delay control data inputted thereto from the first delay controlling inverter $236_1$ and the lower bit $D_2$ of the delay control data inputted thereto from the delay controlling register 235 exhibit low level. The fourth delay controlling NOR gate $237_4$ turns ON the fourth transfer gate $232_4$ and the eighth transfer gate $232_8$ when both the inverted signal of the upper bit $D_1$ of the delay control data inputted thereto from the first delay controlling inverter $236_1$ and the inverted signal of the lower bit $D_2$ of the delay control data inputted thereto from the second delay controlling inverter $236_2$ exhibit low level.

The operation of the two-phase clock generation circuit 200 will next be described on the assumption that the delay times of the first to eighth delay circuits $231_1$–$231_8$ are all equal to "dt". In the two-phase clock generation circuit 200, when delay control data in which upper bit $D_1$ and lower bit $D_2$ both exhibit low level are stored into the delay controlling register 235, only the output signal of the first delay controlling NOR gate $237_1$ changes to high level, and consequently, the first transfer gate $232_1$ and the fifth transfer gate $232_5$ are turned ON. As a result, the output signal $DS_1$ of the first delay circuit $231_1$ inputted to the second NAND gate 214 and the second NOR gate 215 is a signal obtained by delaying the output signal of the first NOR gate 213 by the delay time dt since it is provided as the output signal of the first NOR gate 213 after passing the first transfer gate $232_1$ and the first delay circuit $231_1$. Meanwhile, the output signal $DS_2$ of the fifth delay circuit $231_5$ inputted to the first NAND gate 212 and the first NOR gate 213 is a signal obtained by delaying the output signal of the second NOR gate 215 by the delay time dt since it is provided as the output signal of the second NOR gate 215 after passing the fifth transfer gate $232_5$ and the fifth delay circuit $231_5$. On the other hand, when delay control data wherein the upper bit $D_1$ has low level and the lower bit $D_2$ has high level are stored into the delay controlling register 235, only the output signal of the second delay controlling NOR gate $237_2$ changes to high level, and consequently, the second transfer gate $232_2$ and the sixth transfer gate $232_6$ are turned ON. As a result, the output signal $DS_1$ of the first delay circuit $231_1$ inputted to the second NAND gate 214 and the second NOR gate 215 is a signal obtained by delaying the output signal of the first NOR gate 213 by the delay time "2×dt" since it is provided as the output signal of the first NOR gate 213 after passing the second transfer gate $232_2$, the second delay circuit $231_2$, and the first delay circuit $231_1$. In the meantime, the output signal $DS_2$ of the fifth delay circuit $231_5$ inputted to the first NAND gate 212 and the first NOR gate 213 is a signal obtained by delaying the output signal of the second NOR gate 215 by the delay time "2× dt" since it is provided as the output signal of the second NOR gate 215 signal after passing the sixth transfer gate $232_6$, the sixth delay circuit $231_6$, and the fifth delay circuit $231_5$. Further, when delay control data wherein the upper bit $D_1$ has high level and the lower bit $D_2$ has low level are stored into the delay controlling register 235, only the output signal of the third delay controlling NOR gate $237_3$ changes to high level, and consequently, the third transfer gate $232_3$ and the seventh transfer gate $232_7$ are turned ON. As a result, the output signal $DS_1$ of the first delay circuit $231_1$ inputted to the second NAND gate 214 and the second NOR gate 215 is a signal obtained by delaying the output signal of the first NOR gate 213 by the delay time "3× dt" since it is provided as the output signal of the first NOR gate 213 after passing the "third transfer gate $232_3$, the third delay circuit $231_3$, the second delay circuit $231_2$, and the first delay circuit $231_1$. On the other hand, the output signal $DS_2$ of the fifth delay circuit $231_5$ inputted to the first NAND gate 212 and the first NOR gate 213 is a signal obtained by delaying the output signal of the second NOR gate 215 by the delay time "3×dt" since it is provided as the output signal of the second NOR gate 215 after passing the seventh transfer gate $232_7$, the seventh delay circuit $231_7$, the sixth delay circuit $231_6$, and the fifth delay circuit $231_5$. Meanwhile, when delay control data wherein the upper bit $D_1$ and the lower bit $D_2$ both have high level are stored into the delay controlling register 235, only the output signal of the fourth delay controlling NOR gate $237_4$ changes to high level, and consequently, the fourth transfer gate $232_4$ and the eighth transfer gate $232_8$ are turned ON. As a result, the output signal $DS_1$ of the first delay circuit $231_1$ inputted to the second NAND gate 214 and the second NOR,gate 215 is a signal obtained by delaying the output signal of the first NOR gate 213 by the delay time "4×dt" since it is provided as the output signal of the first NOR gate 213 after passing the fourth transfer gate $232_4$, the fourth delay circuit $231_4$, the third delay circuit $231_3$, the second delay circuit $231_2$, and the first delay circuit $231_1$. Meanwhile, the output signal $DS_2$ of the fifth delay circuit $231_5$ inputted to the first NAND gate 212 and the first NOR gate 213 is a signal obtained by delaying the output signal of the second NOR gate 215 by the delay time "4×dt" since it is provided as the output signal of the second NOR gate 215 after passing the eighth delay circuit $231_8$, the seventh delay circuit $231_7$, the sixth delay circuit $231_6$, and the fifth delay circuit $231_5$. Accordingly, with the two-phase clock generation circuit 200, the delay times of the first delay circuit 16 and the second delay circuit 17 shown in FIG. 4 can be set to four different delay times. It is to be noted that, by setting the number of bits of the delay control data to be stored into the delay controlling register 235 to "n" and setting the number of stages of two sets of delay circuits to "$2^n$", "$2^n$" different delay times can be set.

Figure 11:
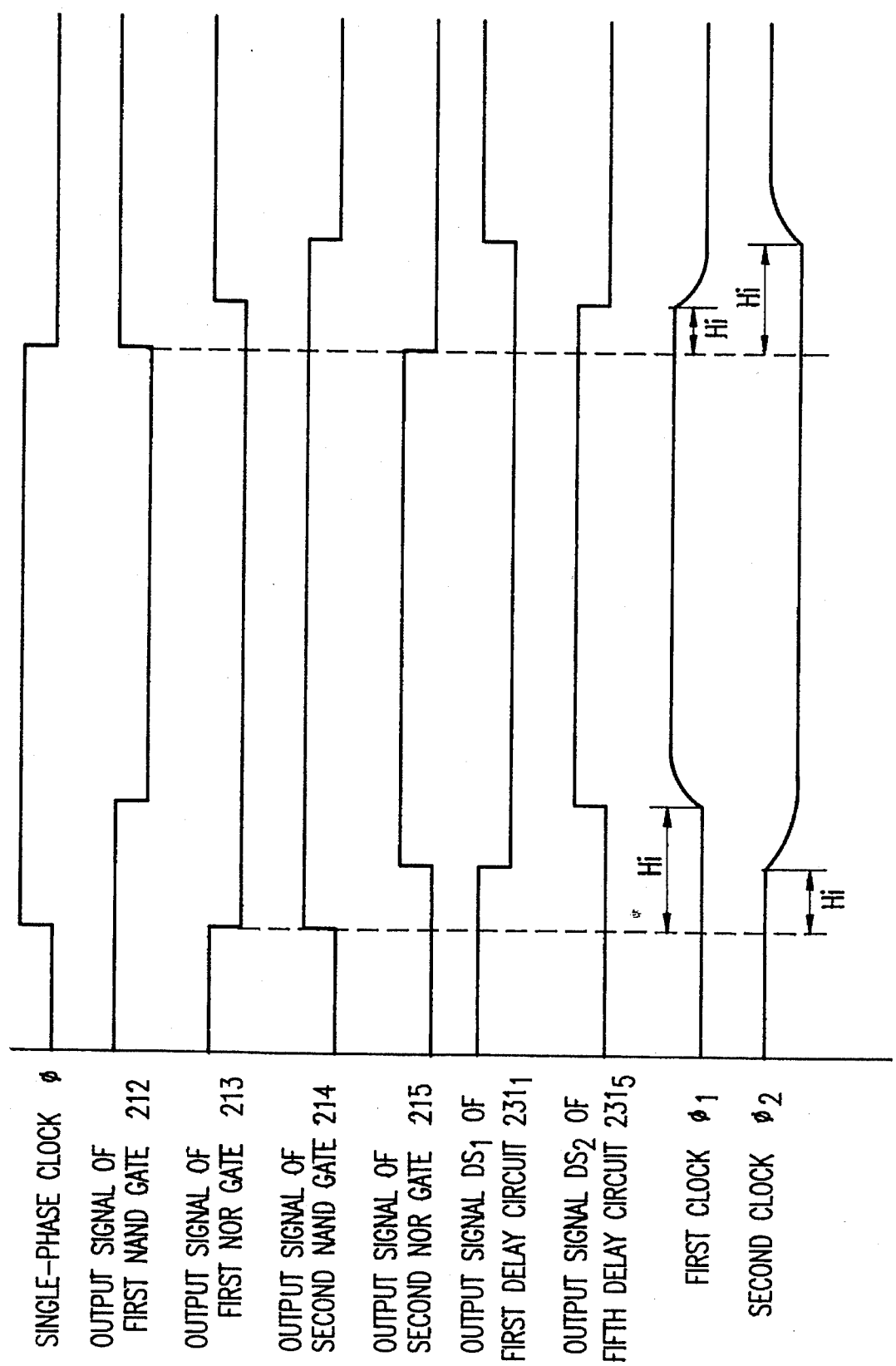
FIG. 11 is a timing chart illustrating operation of the two-phase clock generation circuit shown in FIG. 10 when the voltage is low.
Figure 12:
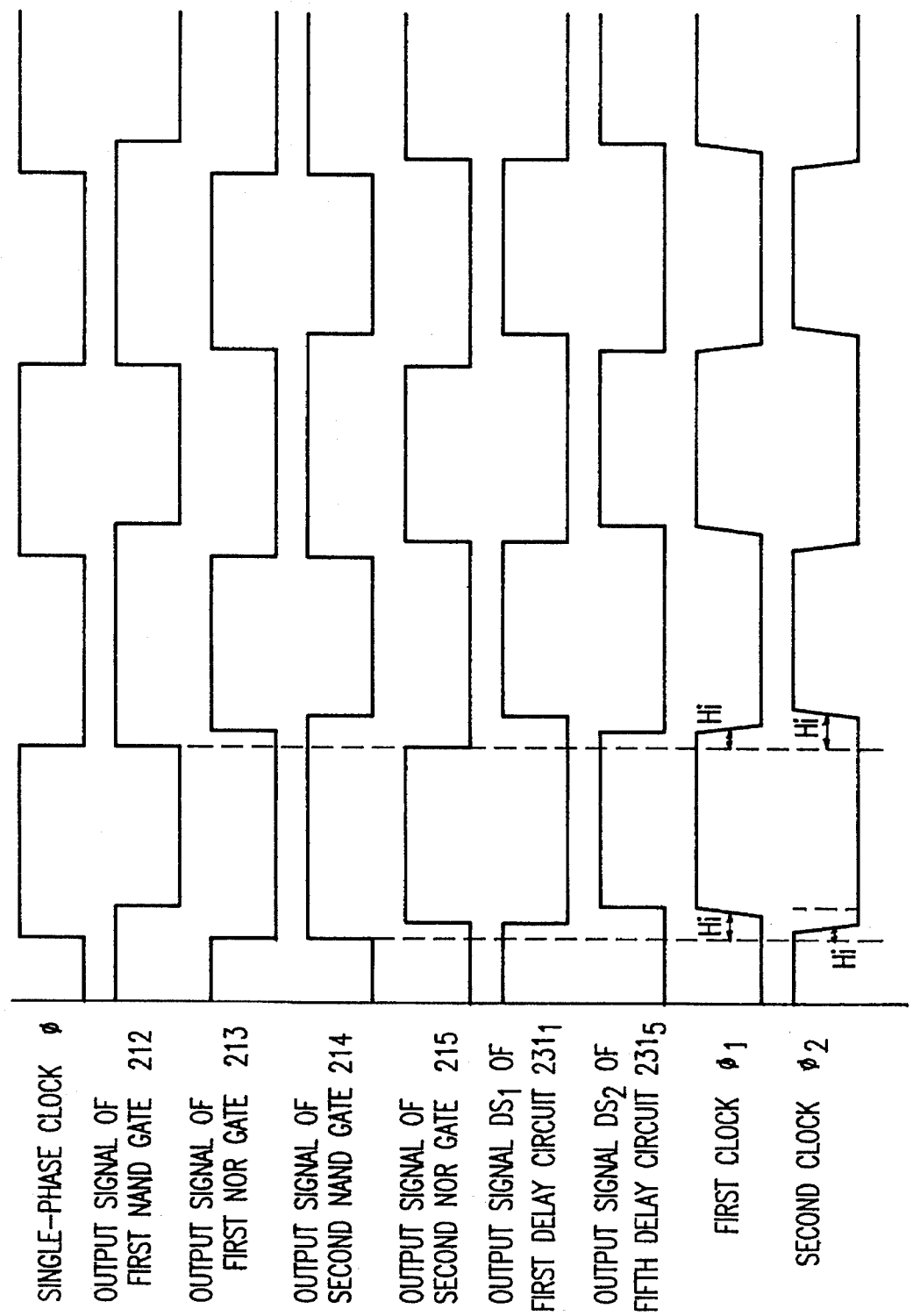
FIG. 12 is a timing chart illustrating operation of the two-phase clock generation circuit shown in FIG. 10 when the voltage is high.

For example, when the voltage is as low as, for example, 3 V (that is, in low-speed operation), the waveforms of rising edges and falling edges of the first and second clocks $\phi_1$ and $\phi_2$ become deformed as seen from FIG. 11 due to an influence of the capacitance of several elements beginning with first and second drivers 218 and 219. In this instance, if the delay times of the first and second delay times 16 and 17 are fixed as in the two-phase clock generation circuit 10 shown in FIG. 4, a period within which the first clock $\phi_1$ and the second clock $\phi_2$ are both active (that is, a period within which they are at high level) is present, and consequently, where the first and second clocks $\phi_1$ and $\phi_2$ are used as latching clocks for latches, for example, of the master-slave configuration, a malfunction such as direct transmission of data occurs. On the other hand, when the voltage is as high as, for example, 5 V (that is, in high-speed operation), the deformation of the waveforms of rising and falling edges of the first and second clocks $\phi_1$ and $\phi_2$ is limited as shown in FIG. 12. However, if the delay between clocks defined by the time from the falling edge of the second clock $\phi_2$ to the rising edge of the first clock $\phi_1$ or the time from the falling edge of the first clock $\phi_1$ to the rising edge of the second clock $\phi_2$ is set to an excessively great value, the period of high level of the first or second clock $\phi_1$ or $\phi_2$ then becomes excessively short, and therefore, if the first and second clocks $\phi_1$ and $\phi_2$ are used as latching clocks for latches of, for example, the master-slave configuration, problems such as failure to latch data may occur. However, with the two-phase clock generation circuit 200 shown in FIG. 10, the above-described problem can be prevented by changing delay control data to be stored into the delay controlling register 235 so that, when the voltage is low, the delay between clocks may be increased, but when the voltage is high, the delay between clocks may be decreased.

It is to be noted that, in the two-phase clock generation circuit 200, while the delay between clocks is set in accordance with delay control data stored into the delay controlling register 235, the delay between clocks can be set otherwise by inputting delay control data from an external terminal. Further, as with the four-phase clock generation circuit 50 shown in FIG. 8, the delay between clocks can be set arbitrarily by making the delay times of the first to fourth delay circuits $74_1$ to $74_4$ variable.

While the present invention has been described in conjunction with preferred embodiments thereof, it will now be possible for one skilled in the art to easily put the present invention into practice in various other manners.

What is claimed is:

1. A polyphase clock generation circuit comprising:

a first power source voltage terminal;

a second power source voltage terminal;

a first clock driver including a P-channel field-effect transistor with a source connected to the first power source voltage terminal, and an N-channel field-effect transistor with a source connected to the second power source voltage terminal and a drain connected to a drain of the P-channel field-effect transistor, said first clock driver producing a first clock signal;

a second clock driver including a P-channel field-effect transistor with a source connected to the first power source voltage terminal, and an N-channel field-effect transistor with a source connected to the second power source voltage terminal and a drain connected to a drain of the P-channel field-effect transistor, said second clock driver producing a second clock signal; and clock driver driving means for turning on the P-channel field-effect transistor and the N-channel field-effect transistor of said first and second clock drivers alternately and independently of each other so that the P-channel field-effect transistor and the N-channel field-effect transistor may not have an ON-state simultaneously with each other, said clock driver driving means including delay means interconnecting said first and second clock drivers so that the first clock signal and the second clock signal do not present an overlapping condition of high level.

2. The polyphase clock generation circuit as claimed in claim 1 wherein the second power source voltage terminal is grounded.

3. A polyphase clock generation circuit comprising:

a first power source voltage terminal;

a second power source voltage terminal;

inverting means for inverting a polarity of a single-phase clock to produce an inverted clock;

first logical AND means;

first logical OR means;

second logical AND means;

second logical OR means;

a first clock driver including a first P-channel field-effect transistor with a gate to which the output signal of the first logical AND means is inputted and a source connected to the first power source voltage terminal, and a first N-channel field-effect transistor with a gate to which the output signal of the first logical OR means is inputted, a source connected to the second power source voltage terminal, and a drain connected to a drain of the first P-channel field-effect transistor;

a second clock driver including a second P-channel field-effect transistor with a gate to which the output signal of the second logical AND means is inputted and a source connected to the first power source voltage terminal, and a second N-channel field-effect transistor with a gate to which the output signal of the second logical OR means is inputted, a source connected to the second power source voltage terminal, and a drain connected to a drain of the second P-channel field-effect transistor;

first delay means for delaying the output signal of the first logical OR means by a predetermined first delay time; and second delay means for delaying the output signal of the second logical OR means by a predetermined second delay time;

the single-phase clock and the output signal of the second delay means being inputted to the first logical AND means and the first logical OR means; and the inverted clock outputted from the inverting means and the output signal of the first delay means being inputted to the second logical AND means and the second logical OR means.

4. The polyphase clock generation circuit as claimed in claim 3 wherein the second power source voltage terminal is grounded.

5. A polyphase clock generation circuit comprising:

a first power source voltage terminal;

a second power source voltage terminal;

inverting means for inverting a polarity of a single-phase clock to produce an inverted clock;

first logical AND means;

first logical OR means;

second logical AND means;

second logical OR means;

a first clock driver including a first P-channel field-effect transistor with a gate to which the output signal of the first logical AND means is inputted and a source connected to the first power source voltage terminal, and a first N-channel field-effect transistor with a gate to which the output signal of the first logical OR means is inputted, a source connected to the second power source voltage terminal, and a drain connected to a drain of the first P-channel field-effect transistor;

a second clock driver including a second P-channel field-effect transistor with a gate to which the output signal of the second logical AND means is inputted and a source connected to the first power source voltage terminal, and a second N-channel field-effect transistor with a gate to which the output signal of the second logical OR means is inputted, a source connected to the second power source voltage terminal, and a drain connected to a drain of the second P-channel field-effect transistor;

first delay means for delaying the output signal of the first logical AND means by a predetermined first delay time; and second delay means for delaying the output signal of the second logical AND means by a predetermined second delay time;

the single-phase clock and the output signal of the second delay means being inputted to the first logical AND means and the first logical OR means; and the inverted clock outputted from the inverting means and the output signal of the first delay means being inputted to the second logical AND means and the second logical OR means.

6. The polyphase clock generation circuit as claimed in claim 5 wherein the second power source voltage terminal is grounded.

7. A polyphase clock generation circuit comprising:

a first power source voltage terminal;

a second power source voltage terminal;

inverting means for inverting a polarity of a single-phase clock to produce an inverted clock;

first logical AND means;

first logical OR means;

second logical AND means;

second logical OR means;

a first clock driver including a first P-channel field-effect transistor with a gate to which the output signal of the first logical AND means is inputted and a source connected to the first power source voltage terminal, and a first N-channel field-effect transistor with a gate to which the output signal of the first logical OR means is inputted, a source connected to the second power source voltage terminal, and a drain connected to a drain of the first P-channel field-effect transistor;

a second clock driver including a second P-channel field-effect transistor with a gate to which the output signal of the second logical AND means is inputted and a source connected to the first power source voltage terminal, and a second N-channel field-effect transistor with a gate to which the output signal of the second logical OR means is inputted, a source connected to the second power source voltage terminal, and a drain connected to a drain of the second P-channel field-effect transistor;

first variable delay means for delaying the output signal of the first logical OR means by a first delay time; and second variable delay means for delaying the output signal of the second logical OR means by a second delay time;

the single-phase clock and the output signal of the second variable delay means being inputted to the first logical AND means and the first logical OR means; and the inverted clock outputted from the inverting means and the output signal of the first variable delay means being inputted to the second logical AND means and the second logical OR means.

8. The polyphase clock generation circuit as claimed in claim 7 wherein the second power source voltage terminal is grounded.

9. The polyphase clock generation circuit as claimed in claim 7 further comprising delay time setting means for setting the first delay time of the first variable delay means and the second delay time of the second variable delay means.

10. The polyphase clock generation circuit as claimed in claim 9 wherein the second power source voltage terminal is grounded.

11. A polyphase clock generation circuit comprising:

a first power source voltage terminal;

a second power source voltage terminal;

inverting means for inverting a polarity of a single-phase clock to produce an inverted clock;

first logical AND means;

first logical OR means;

second logical AND means;

second logical OR means;

a first clock driver including a first P-channel field-effect transistor with a gate to which the output signal of the first logical AND means is inputted and a source connected to the first power source voltage terminal, and a first N-channel field-effect transistor with a gate to which the output signal of the first logical OR means is inputted, a source connected to the second power source voltage terminal, and a drain connected to a drain of the first P-channel field-effect transistor;

a second clock driver including a second P-channel field-effect transistor with a gate to which the output signal of the second logical AND means is inputted and a source connected to the first power source voltage terminal, and a second N-channel field-effect transistor with a gate to which the output signal of the second logical OR means is inputted, a source connected to the second power source voltage terminal, and a drain connected to the drain of the second P-channel field-effect transistor;

first variable delay means for delaying the output signal of the first logical AND means by a first delay time; and second variable delay means for delaying the output signal of the second logical AND means by a second delay time;

the single-phase clock and the output signal of the second variable delay means being inputted to the first logical AND means and the first logical OR means; and the inverted clock outputted from the inverting means and the output signal of the first variable delay means being inputted to the second logical AND means and the second logical OR means.

12. The polyphase clock generation circuit as claimed in claim 11 wherein the second power source voltage terminal is grounded.

13. The polyphase clock generation circuit as claimed in claim 11, further comprising delay time setting means for setting the first delay time of the first variable delay means and the second delay time of the second variable delay means.

14. The polyphase clock generation circuit as claimed in claim 13 wherein the second power source voltage terminal is grounded.

15. A polyphase clock generation circuit comprising:

a first power source voltage terminal;

a second power source voltage terminal;

frequency dividing means for dividing a frequency of a single-phase clock to produce a plurality of divided frequency signals; and a plurality of outputting means each including first logical AND means, second logical AND means, logical OR means, delay means for delaying the output signal of the logical OR means by a predetermined delay time, and a clock driver having a P-channel field-effect transistor with a gate to which the output signal of the first logical AND means is inputted and a source connected to the first power source voltage terminal, and having an N-channel field-effect transistor with a gate to which the output signal of the logical OR means is inputted, a source connected to the second power source voltage terminal, and a drain connected to a drain of the P-channel field-effect transistor;

the frequency dividing means producing the plurality of divided frequency signals so that any of the plurality of divided frequency signals has a period of high level which does not overlap with a period of high level of any of the other divided frequency signals;

one of the plurality of divided frequency signals generated by the frequency dividing means and the output signals of the delay means which constitute the plurality of outputting means except for one of the plurality of outputting means being inputted to the first logical AND means which constitutes the one of the plurality of outputting means;

the output signals of the delay means which constitute the plurality of outputting means except for the one of the plurality of outputting means being inputted to the second logical AND means which constitutes the one of the plurality of outputting means; and the one of the plurality of divided frequency signals generated by the frequency dividing means and the output signal of the second logical AND means being inputted to the logical OR means which constitutes the one of the plurality of outputting means.

16. The polyphase clock generation circuit as claimed in claim 15 wherein the second power source voltage terminal is grounded.

17. A polyphase clock generation circuit comprising:

a first power source voltage terminal;

a second power source voltage terminal;

frequency dividing means for dividing a frequency of a single-phase clock to produce a plurality of divided frequency signals; and a plurality of outputting means each including first logical AND means, second logical AND means, logical OR means, variable delay means for delaying the output signal of the logical OR means, and a clock driver having a P-channel field-effect transistor with a gate to which the output signal of the first logical AND means is inputted and a source connected to the first power source voltage terminal and having an N-channel field-effect transistor with a gate to which the output signal of the logical OR means is inputted, a source connected to the second power source voltage terminal, and a drain connected to a drain of the P-channel field-effect transistor;

the frequency dividing means producing the plurality of divided frequency signals so that any of the plurality of divided frequency signals has a period of high level which does not overlap with a period of high level of any of the other divided frequency signals;

one of the plurality of divided frequency signals generated by the frequency dividing means and the output signals of the variable delay means which constitute the plurality of outputting means except for one of the plurality of outputting means being inputted to the first logical AND means which constitutes the one of the plurality of outputting means;

the output signals of the variable delay means which constitute the plurality of outputting means except for the one of the plurality of outputting means being inputted to the second logical AND means which constitutes the one of the plurality of outputting means; and the one of the plurality of divided frequency signals generated by the frequency dividing means and the output signal of the second logical AND means being inputted to the logical OR means which constitutes the one of the plurality of outputting means.

18. The polyphase clock generation circuit as claimed in claim 17 wherein the second power source voltage terminal is grounded.

19. The polyphase clock generation circuit as claimed in claim 17 further comprising delay time setting means for setting delay times of the variable delay means which constitute the plurality of outputting means.

20. The polyphase clock generation circuit as claimed in claim 19 wherein the second power source voltage terminal is grounded.

* * * * *